(12) United States Patent
Piret et al.

(10) Patent No.: US 6,404,360 B1
(45) Date of Patent: Jun. 11, 2002

(54) INTERLEAVING METHOD FOR THE TURBOCODING OF DATA

(75) Inventors: Philippe Piret, Cesson-Sevigne; Claude Le Dantec, Saint Hilaire des Landes, both of (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/699,499

(22) Filed: Oct. 31, 2000

(30) Foreign Application Priority Data

Nov. 4, 1999 (FR) .............................. 99 13835
Feb. 10, 2000 (FR) .............................. 00 01659

(51) Int. Cl.$^7$ ................................................ H03M 7/00
(52) U.S. Cl. ...................................................... 341/81
(58) Field of Search .............................. 341/81, 82, 51

(56) References Cited

U.S. PATENT DOCUMENTS 4,394,642 A    7/1983  Currie et al. ............... 340/347
5,936,559 A *  8/1999  Howard ....................... 341/81
5,940,863 A *  8/1999  Fimoff ........................ 341/81

FOREIGN PATENT DOCUMENTS

EP    928071    7/1999
EP    952673   10/1999

* cited by examiner

*Primary Examiner*—Brian Young
(74) *Attorney, Agent, or Firm*—Fitzpatrick, Cella, Harper & Scinto

(57) ABSTRACT

The invention concerns a method and device for interleaving data forming part of a transmission or reception method. More particularly, the object of the present invention is an interleaving and deinterleaving method, intended to form part of a so-called "turbocoding" method and the associated turbodecoding method, with the aim of proposing more efficient interleavers for a turbocoder, that is to say ones making it possible to obtain a greater minimum distance for the code.

38 Claims, 17 Drawing Sheets

| $W_H(a) = 2$ | | | | | | | | | | | |
|---|---|---|---|---|---|---|---|---|---|---|---|
| fsp($v$) | 2 | 3 | 4 | 5 | 6 | 7 | 8 | 9 | 10 | 11 | 12 |
| $W_H(abc)$ | 14 | 18 | 22 | 26 | 30 | 34 | 38 | 42 | 46 | 50 | 54 |
| $W_H(a) = 4$ | | | | | | | | | | | |
| fsp($v$) | 4 | 5 | 6 | 7 | 8 | 9 | 10 | 11 | | | |
| $W_H(abc)$ | 28 | 32 | 36 | 40 | 44 | 48 | 52 | 56 | | | |
| $W_H(a) = 6$ | | | | | | | | | | | |
| fsp($v$) | 6 | 7 | 8 | 9 | | | | | | | |
| $W_H(abc)$ | 42 | 46 | 50 | 54 | | | | | | | |

FIG. 2

| $A_0^0$ | $A_0^1$ | $A_0^2$ | $A_0^3$ | $A_0^4$ | $A_0^5$ | $A_0^6$ |
|---|---|---|---|---|---|---|
| $A_1^0$ | $A_1^1$ | | | | | $A_1^6$ |
| $A_2^0$ | | | | $A_2^4$ | | |
| $A_3^0$ | | | | | | |
| $A_4^0$ | | | | | | |
| $A_5^0$ | | | | | | |
| $A_6^0$ | $A_6^1$ | $A_6^2$ | $A_6^3$ | $A_6^4$ | $A_6^5$ | $A_6^6$ |

$$S = \begin{bmatrix} 0 & 1 & 2 & 3 & 4 & 5 & 6 \\ 7 & 8 & 9 & 10 & 11 & 12 & 13 \\ 14 & 15 & 16 & 17 & 18 & 19 & 20 \\ 21 & 22 & 23 & 24 & 25 & 26 & 27 \\ 28 & 29 & 30 & 31 & 32 & 33 & 34 \\ 35 & 36 & 37 & 38 & 39 & 40 & 41 \\ 42 & 43 & 44 & 45 & 46 & 47 & 48 \\ 49 & 50 & 51 & 52 & 53 & 54 & 55 \end{bmatrix}$$

FIG. 10

$$S^* = \begin{bmatrix} 5 & 29 & 11 & 51 & 34 & 0 & 24 \\ 19 & 36 & 18 & 44 & 27 & 7 & 31 \\ 40 & 50 & 25 & 37 & 41 & 14 & 38 \\ 54 & 1 & 32 & 30 & 20 & 21 & 45 \\ 47 & 15 & 39 & 23 & 48 & 28 & 52 \\ 12 & 22 & 46 & 16 & 13 & 35 & 3 \\ 33 & 43 & 4 & 9 & 55 & 42 & 10 \\ 26 & 8 & 53 & 2 & 6 & 49 & 17 \end{bmatrix}$$

FIG. 11

INTERLEAVING METHOD FOR THE TURBOCODING OF DATA

The invention lies within the general field of information transfer methods. It concerns more particularly a method and device for interleaving data forming part of a transmission or reception method.

The invention finds its place in the general field of the coding of data with a view to their transmission or reception, for example by a radio system. Conventionally there are known in this field coders of the particular type known as "turbocoders" (and the associated decoding devices known as "turbodecoders") described for example in previous patents by the same applicant. Such a turbocoder and the associated decoder use one or more data interleaving devices.

The object of the present invention is an interleaving and deinterleaving method, intended to form part of such a so-called "turbocoding" method and the associated turbodecoding method.

The present invention applies equally well to the coding of data representing a physical quantity, to the coding of data able to modulate a physical quantity, to the decoding of modulated signals in the form of data, and to the decoding of data representing physical quantities or to the management of data transmissions. These data can, for example, represent images, sounds, computer data, electrical quantities or stored data.

When convolutional coders are used for implementing an iterative decoding using elementary decoders with soft inputs and outputs, these codes are greatly improved when their coders contain a permutation device, also referred to as an "interleaver", a permutation device making it possible to return to the initial sequence then being called a "deinterleaver". In this case, they are normally referred to as turbocoders and the corresponding iterative decoder is referred to as a "turbodecoder". For convenience:

the operation performed by the turbocoder is referred to as "turbocoding", and this operation supplies a so-called "turbocoded" sequence the operation performed by the turbodecoder is referred to as "turbodecoding", and this operation supplies a "turbodecoded" sequence.

On these subjects, documents which serve as a reference are, on the one hand, the articles by C. Berrou, A. Glavieux and P. Thitimajshima entitled *"Near Shannon Limit Error-Correcting Coding and Decoding: Turbocodes"* published in the proceedings of the ICC'93 conference, 1993, pages 1064 to 1070, and on the other hand the article by C. Berrou and A. Glavieux entitled *"Near Optimum Error-Correcting Coding and Decoding: Turbocodes"* published in IEEE Transactions on Communications, Volume 44, pages 1261 to 1271, in October 1996.

The aim of the present invention is to propose more efficient interleavers for a turbocoder, that is to say ones making it possible to obtain a greater minimum distance. This is particularly important when the signal to noise ratio of the channel is relatively high, since this can then reduce the decoding error rate and consequently avoid having to send again data wrongly received.

It should be stated briefly here that a turbocode has a different behaviour depending on the value of the signal to noise ratio of the channel. If the signal to noise ratio is high, the minimum weight of the non-zero words of the turbocode and the number of these words of minimum weight predominate in the determination of the performance of the turbodecoder. On the other hand, if the signal to noise ratio is low, it appears that it is the number of code words with a weight close to a value greater than or equal to the minimum weight of the code which influences the performance of the turbodecoder.

The invention relates, in a first aspect, to a permutation method, characterised in that it makes an output rank from 0 to $r \cdot m - 1$ correspond to each input rank from 0 to $r \cdot m - 1$, the said method including the following steps:

E1—a matrix S having r rows and m columns is considered, filled row by row by the successive numbers from 0 to $r \cdot m - 1$, E2—each column in said matrix S is divided into a predetermined number $\lambda$ of sub-columns, such that $r/\lambda$ is not prime, E3—the sub-columns of S equal in number to $\lambda \cdot m$ are designated by $S_{\lambda_1}^{\lambda_2}$ with $0 \leq \lambda_1 \leq \lambda - 1$ and $0 \leq \lambda_2 \leq m - 1$ where $\lambda_2$ refers to the column of S where $S_{\lambda_1}^{\lambda_2}$ appears and $\lambda_1$ refers to the position of the sub-column $S_{\lambda_1}^{\lambda_2}$ in the column of index $\lambda_2$.

E4—each sub-column $S_{\lambda_1}^{\lambda_2}$ is then written in the form of a matrix with R rows and M columns (with $r/\lambda = RM$) and in this form it is interleaved by an interleaver of the so-called "wheel" type defined by a circular permutation of each column of said matrix with R rows and M columns, said interleaver not being identity, E5—this matrix with R rows and M columns is reconverted, after said circular permutations on its columns, into a sub-column $S^{*}{}_{\lambda_1}^{\lambda_2}$ which will occupy, in a matrix $S^*$, the same position as that occupied by $S_{\lambda_1}^{\lambda_2}$ in the matrix S, E6—the permutation table consists of pairs each formed by an element of the matrix S and the element with the same position in the matrix $S^*$.

Preferentially, the method also includes, in at least one column $\lambda_2$ ($0 \leq \lambda_2 \leq m-1$) of the matrix $S^*$ a modification of the order of appearance of the sub-columns $S^{*}{}_{\lambda_1}^{\lambda_2}$ in said column.

According to a preferred implementation, one and the same wheel interleaver is used for producing each of the sub-columns $S^{*}{}_{\lambda_1}^{\lambda_2}$ of a given column $\lambda_2$ of the matrix $S^*$.

According to a particular implementation, the sub-columns with at least two columns of the matrix $S^*$ are produced by different wheel interleavers.

According to a more particular implementation, the m wheel interleavers used for interleaving the sub-columns in each column of the matrix $S^*$ are different.

Preferentially, the method also includes a step of permutation of the columns of $S^*$ with each other.

In a particular implementation of the methods described above, the initial matrix S has 2401 elements and is divided into 7 columns of 343 rows, each of these 7 columns itself being divided into 7 sub-columns of 49 elements.

In a preferred embodiment, one chooses: $\lambda=1$. In other words, in this preferred embodiment, when implementing the steps described above, one works with full columns rather than with sub-columns.

To be specific, in this first aspect of the invention, this preferred embodiment relates to a permutation method, causing an output rank from 0 to $r \cdot m - 1$ to correspond to each input rank from 0 to $r \cdot m - 1$, the said method including the followings steps:

E1—a matrix S having r rows and m columns is considered, filled row by row by the successive numbers from 0 to $r \cdot m - 1$, E2—the m columns of S are designated by $S_I$ with $0 \leq I \leq m - 1$, E3—each column $S_l$ is then written in the form of a matrix with R rows and M columns, where R and M satisfy RM=r, and in this form it is interleaved by an interleaver of the so-called "wheel" type, defined by a circular permutation of each column in said matrix with R rows and M columns, said interleaver not being identity, E4—this matrix with R rows and M columns is reconverted, after said circular permutations on its columns, into a column $S^*_l$ which will occupy, in a matrix $S^*$, the same position as that occupied by $S_l$ in the matrix S, E5—each column $S^*_l$ in the matrix $S^*$ is permuted by means of a circular permutation, E6—the permutation table consists of pairs each formed by an element of the matrix S and the element with the same position in the matrix $S^*$.

It will be understood that in this way a permutation table has indeed been created which makes an output rank correspond to each input rank, this permutation table then advantageously being able to be used as a data transfer device, for example using convolutional data turbodecoding.

According to various provisions, possibly used in conjunction, favourable to an effective implementation of this preferred embodiment of the invention:

at least two columns in the matrix $S^*$ are obtained by using different wheel interleavers, the m wheel interleavers used for producing the m columns in the matrix $S^*$ are all different, the method also includes a step of permuting the columns of $S^*$ with each other, during step E5 at least one column $S^*_l$ in the matrix $S^*$ is permuted by means of a circular permutation different from identity.

In a particular implementation of this preferred embodiment, the initial matrix S includes 2415 elements and is divided into 7 columns of 345 rows, each of these 7 columns being itself rewritten in the form of a matrix with 23 rows and 15 columns.

The above-described preferred embodiment of the invention (characterized, to repeat, by λ=1) is simpler to implement than the general case. Therefore, it will be easier (as described in detail further below) to adjust the various parameters of the coding method according to the invention, in order to obtain a turbocode offering a very low error rate when transmitting coded data.

Returning now to the general case (λ larger or equal to 1), the invention relates, in a second aspect, to a method of permuting symbols in a sequence of binary data, representing a physical quantity, represented by a polynomial $$a(x) = \sum_{j,k} a_{j,k} x^{jm+k},$$

with binary coefficients, divisible by a first divisor polynomial $$g(x) = 1 + \sum_{i=1}^{l-1} g_i x^i + x^l,$$

with binary coefficients, supplying a new sequence of binary symbols represented by a polynomial $$a^*(x) = \sum_{j,k} a_{j,k} x^{s^*_{j,k}},$$

divisible by a second divisor polynomial $$g^*(x) = 1 + \sum_{i=1}^{l-1} g^*_i x^i + x^l,$$

characterised in that $s^*_{j,k}$ is the element in position (j,k) in the matrix $S^*$ obtained according to a method as succinctly disclosed above, and m is a multiple of the smallest integer m' such that the first divisor polynomial g(x) divides $x^{m'}+1$.

In this second aspect, the invention also relates to a method of permuting the symbols in a sequence of binary data, representing a physical quantity, represented by a polynomial $$a(x) = \sum_{j,k} a_{j,k} x^{jm+k},$$

with binary coefficients, divisible by a first divisor polynomial $$g(x) = 1 + \sum_{i=1}^{l-1} g_i x^i + x^l,$$

with binary coefficients, supplying a new sequence of binary symbols represented by a polynomial $$a^*(x) = \sum_{j,k} a_{s^*_{j,k}} x^{jm+k},$$

divisible by a second divisor polynomial $$g^*(x) = 1 + \sum_{i=1}^{l-1} g^*_i x^i + x^l,$$

characterised in that $s^*_{j,k}$ is the element in position (j,k) in the matrix $S^*$ obtained according to a method as succinctly disclosed above, and m is a multiple of the smallest integer m' such that the first divisor polynomial g(x) divides $x^{m'}+1$.

According to a particular embodiment, which procures a simplification in implementation, the second divisor polynomial $g^*(x)$ is equal to the first divisor polynomial g(x).

In a third aspect, the invention relates to a coding method characterised in that it includes an operation of determining a sequence $a^*$, during which at least one permutation method as succinctly disclosed above is implemented.

According to a particular implementation of the coding method, working on sequences of binary data u representing information and taking into account a first divisor polynomial $$g(x) = 1 + \sum_{i=1}^{l-1} g_i x^i + x^l,$$

a second divisor polynomial $g^*(x)$ compatible with g(x), a first multiplier polynomial $f_1(x)$ and a second multiplier polynomial $f_2(x)$, an integer number r≧1, said method includes:

an operation of forming a "first" sequence, referred to as "sequence a", represented by a polynomial a(x) referred to as the "first polynomial", whose first r·m−t coefficients of increasing order are the binary data to be coded and whose last t coefficients are chosen in such a way that the polynomial g(x) divides the polynomial a(x)

an operation of forming a second sequence referred to as "sequence b" represented by a polynomial b(x) equal to the product of the first polynomial a(x) and the first multiplier polynomial $f_1(x)$, the whole divided by the first divisor polynomial g(x), a permutation operation, working on binary data in the first sequence a in order to form a so-called "permuted" sequence a* represented by a so-called "permuted" polynomial a*(x), whose coefficients of increasing order are the binary data of the permuted sequence a*, and which is divisible by the second divisor polynomial g*(x), an operation of forming a third sequence referred to as "sequence c" represented by a polynomial c(x) equal to the product of the permuted polynomial a*(x) and the second multiplier polynomial $f_2(x)$, the whole divided by the second divisor polynomial g*(x).

The invention, in this third aspect, also relates to a decoding method implementing at least one permutation method as previously disclosed.

The invention likewise relates to a turbodecoding method using at least one permutation method as previously disclosed.

According to an advantageous arrangement of the methods disclosed above, the alphabet on which the turbocode is defined contains q letters, with q a power of a prime number, the alphabet receiving the structure of the Galois field with q elements.

In a fourth aspect, the invention relates to an interleaver (or permutation device) able to supply, from a sequence a of binary data representing a physical quantity, represented by a polynomial $$a(x) = \sum_{j,k} a_{j,k} x^{jm+k},$$

divisible by a first divisor polynomial g(x), and whose coefficients of increasing order are the binary data of the sequence a, a permuted sequence a* associated with a polynomial a*(x) whose coefficients of increasing order are the binary data of the sequence a*, said polynomial a*(x) being intended to be divided by a second divisor polynomial g*(x) compatible with the first divisor polynomial g(x), in order to form a sequence of binary data c, and a having a number of binary data equal to the product of an integer number r and the integer m, m being a multiple of the smallest integer m' such that the first divisor polynomial g(x) divides $x^{m'}+1$, characterised in that the permuted sequence a* is given by $$\sum_{j,k} a_{j,k} x^{s^*_{j,k}},$$

where the matrix S* with elements $s^*_{j,k}$ is produced according to a permutation table creation method as disclosed above.

The invention also relates, in this fourth aspect, to an interleaver adapted to supply, from a sequence a of binary data representing a physical quantity, associated with a polynomial $$a(x) = \sum_{j,k} a_{j,k} x^{jm+k},$$

divisible by a first divisor polynomial g(x), and whose coefficients of increasing order are the binary data of the sequence a, a permuted sequence a* associated with a polynomial a*(x) whose coefficients of increasing order are the binary data of the sequence a*, said polynomial a*(x) being intended to be divided by a second divisor polynomial g*(x) compatible with the first divisor polynomial g(x), in order to form a sequence of binary data c, and a having a number of binary data equal to the product of any integer number r and the integer m, m being a multiple of the smallest integer m' such that the first divisor polynomial g(x) divides $x^{m'}+1$ characterised in that the permuted sequence a* is given by $$\sum_{j,k} a_{s^*_{j,k}} x^{jm+k},$$

where the matrix S* with elements $s^*_{j,k}$ is obtained according to a permutation table creation method as disclosed above.

It should be noted here that the interleavers obtained satisfy a property referred to in the remainder of the description as "Return to Zero". This means that, when the elementary convolutional coders of the turbocoder are in the null state at the start of the coding of an information sequence, they will both be simultaneously in the null state at the end of the coding of each information sequence.

More precisely, during turbocoding, a sequence is constructed whose polynomial representation a(x) is divisible by a feedback polynomial (also referred to as a divisor polynomial)

$$g(x) = 1 + \sum_{i=1}^{l-1} g_i x^i + x^l,$$

of the turbocoder, by simple addition of well-chosen bits equal in number to the degree of the polynomial g(x), at the end of an input sequence u(x). Let a*(x) be the polynomial representation of the interleaved sequence a(x).

It is said that an interleaver satisfies the property of return to zero (RZ) if, each time that a(x) is divisible by g(x), the corresponding polynomial a*(x) is also divisible by g(x). More generally, the case is considered where the two feedback polynomials denoted g(x) and g*(x) (also referred to as first and second divisor polynomials) are not necessarily equal. It is then said that an interleaver satisfies the property RZ if, each time that a(x) is divisible by g(x), the corresponding polynomial a*(x) is divisible by g*(x) The latter definition makes sense only if g(x) and g*(x) have the following property: if $$g(x) = \prod_i (x - x_i)$$

is the complete factorisation of g(x) in an extension field of the two-element field, then the complete factorisation of $$g^*(x) \text{ is } \prod_i (x - x_i^\varphi)$$

where φ is an automorphism (denoted exponentially) of said extension field. Hereinafter such a polynomial g*(x) will be said to be compatible with g(x). In particular, a polynomial is always compatible with itself. It should be noted that two compatible polynomials have the same degree. In addition, if m is the smallest integer such that the first divisor polynomial g(x) divides $x^m+1$, and m* is the smallest integer such that the second divisor polynomial g*(x) divides $x^{m^*}+1$, g*(x) can be compatible with g(x) only if m=m*.

Consider for example the factorisation $g(x)=(x-\alpha)(x-\alpha^2)(x-\alpha^4)$ of $g(x)=x^3+x+1$ where α is a seventh primitive root of the unit and belongs to the field containing eight elements. Consider the six automorphisms $\phi_i$: $\alpha \rightarrow \alpha^i$ of this eight-element body.

It is verified that $\phi_1$, $\phi_2$ and $\phi_4$ produce g*(x)=g(x) whilst $\phi_3$, $\phi_6$ and $\phi_5$ produce $g^*(x)=x^3+x^2+1$, which is factorised as $g^*(x)=(x-\alpha^3)(x-\alpha^6)(x-\alpha^5)$.

The invention also relates to a coding device having an interleaver as briefly disclosed above, and in particular a coding device working on sequences of binary data u representing information and taking into account a first divisor polynomial $$g(x) = 1 + \sum_{i=1}^{t-1} g_i x^i + x^t,$$

a second divisor polynomial g*(x) compatible with g(x), a first multiplier polynomial $f_1(x)$ and a second multiplier polynomial $f_2(x)$, an integer number r≥1, an integer number m which is a multiple of the smallest integer m' such that the first polynomial g(x) divides $x^{m'}+1$, characterised in that it has:

means of forming a "first" sequence, referred to as "sequence a", represented by a polynomial a(x) referred to as the "first polynomial", whose first r·m−t coefficients of increasing order are the binary data to be coded and whose last t coefficients are chosen in such a way that the polynomial g(x) divides the polynomial a(x)

means of forming a second sequence known as "sequence b" represented by a polynomial b(x) equal to the product of the first polynomial a(x) and the first multiplier polynomial $f_1(x)$, the whole divided by the first divisor polynomial g(x), permutation means, working on binary data in the first sequence a in order to form a so-called "permuted" sequence a* represented by a so-called "permuted" polynomial a*(x), whose coefficients of increasing order are the binary data of the permuted sequence a*, and which is divisible by the second divisor polynomial g*(x), means of forming a third sequence known as "sequence c" represented by a polynomial c(x) equal to the product of the permuted polynomial a*(x) and the second multiplier polynomial $f_2(x)$, the whole divided by the second divisor polynomial g*(x).

Likewise, the invention relates to a decoding device using at least one interleaver as disclosed above and/or a deinterleaver corresponding to this interleaver.

The invention also relates to a turbodecoding device using at least one interleaver as disclosed above and/or a deinterleaver corresponding to this interleaver.

The invention also relates to a device employing interleaving and deinterleaving methods like the ones succinctly presented above.

The invention also relates to a data transmission device having a transmitter adapted to use a packet transmission protocol, having a device as disclosed above.

In a particular embodiment, the data transmission device is such that the protocol is the ATM (Asynchronous Transfer Mode) protocol.

In another embodiment, the protocol is the IP protocol (Internet Protocol).

The invention relates more generally to a telephone, a photographic apparatus, a printer, a scanner, a camera, a computer, a facsimile machine, a television receiver and an audio/video player, characterised in that these devices have a device as briefly disclosed above.

The invention also relates to an information storage means and an information storage means which is removable, partially or totally, and which can be read by a computer or microprocessor storing instructions of a computer program, allowing the implementation of the method succinctly disclosed above.

The following description and drawings will make it possible to have a better understanding of the aims and advantages of the invention. Clearly this description is given by way of example, and has no limiting character. In the drawings:

FIG. 2 is a table of the weights of the encoded homogeneous sequences (a b c) as a function of the full span of the simplified sequence v;

FIG. 3 depicts a division of a matrix A into 49 sub-columns $A_{j1}^{l2}$;

FIG. 4 is a table of 28 septuples h with $h_0=0$ and $h_1=1$;

FIG. 5 is a representation of the matrix A;

FIG. 6 illustrates a permutation of the sub-columns of the matrix A;

FIG. 7 illustrates a more effective permutation of the sub-columns of the matrix A;

FIG. 10 illustrates a matrix S used in the λ=1 embodiment of the invention;

FIG. 11 illustrates a matrix S* obtained from the matrix S of FIG. 10 after an RZ interleaving;

Figure 12:
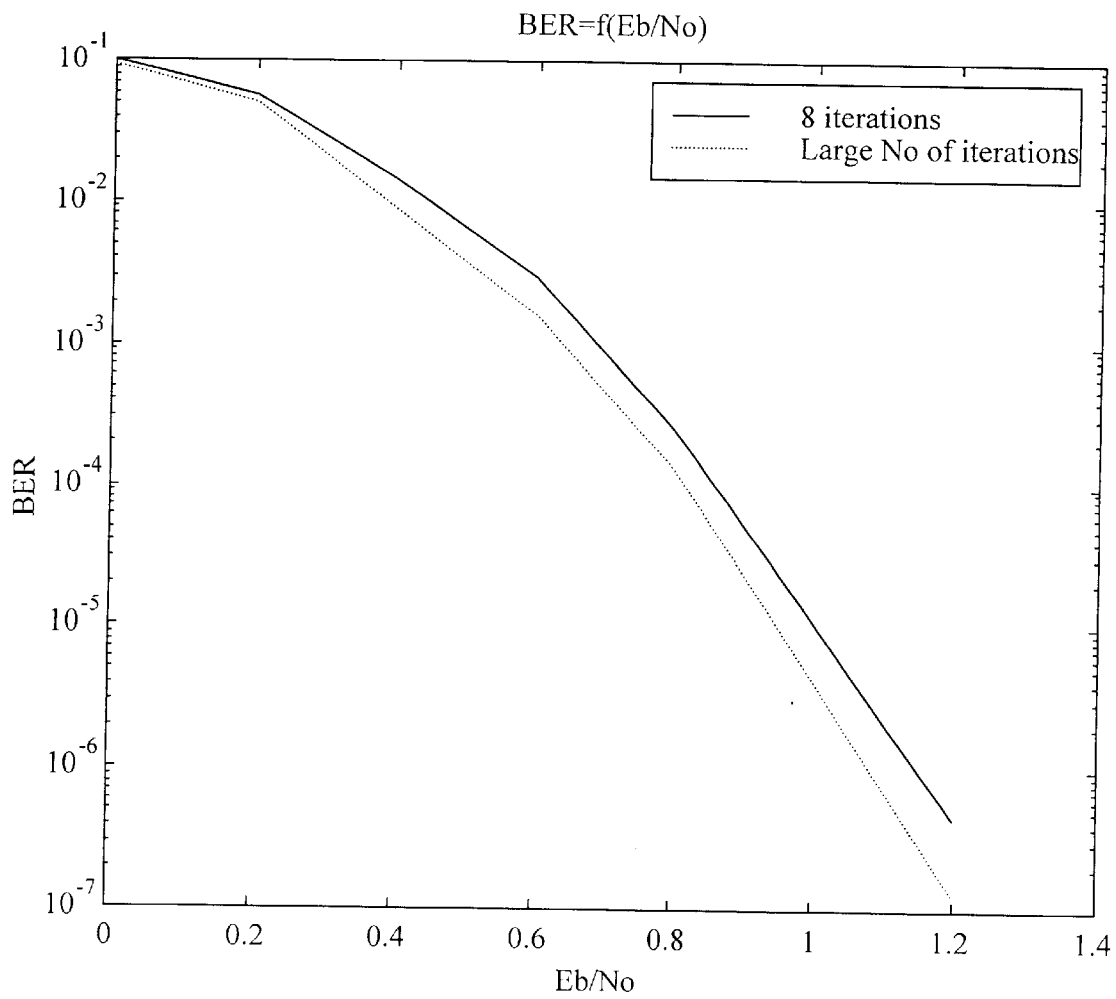
Figure 13:
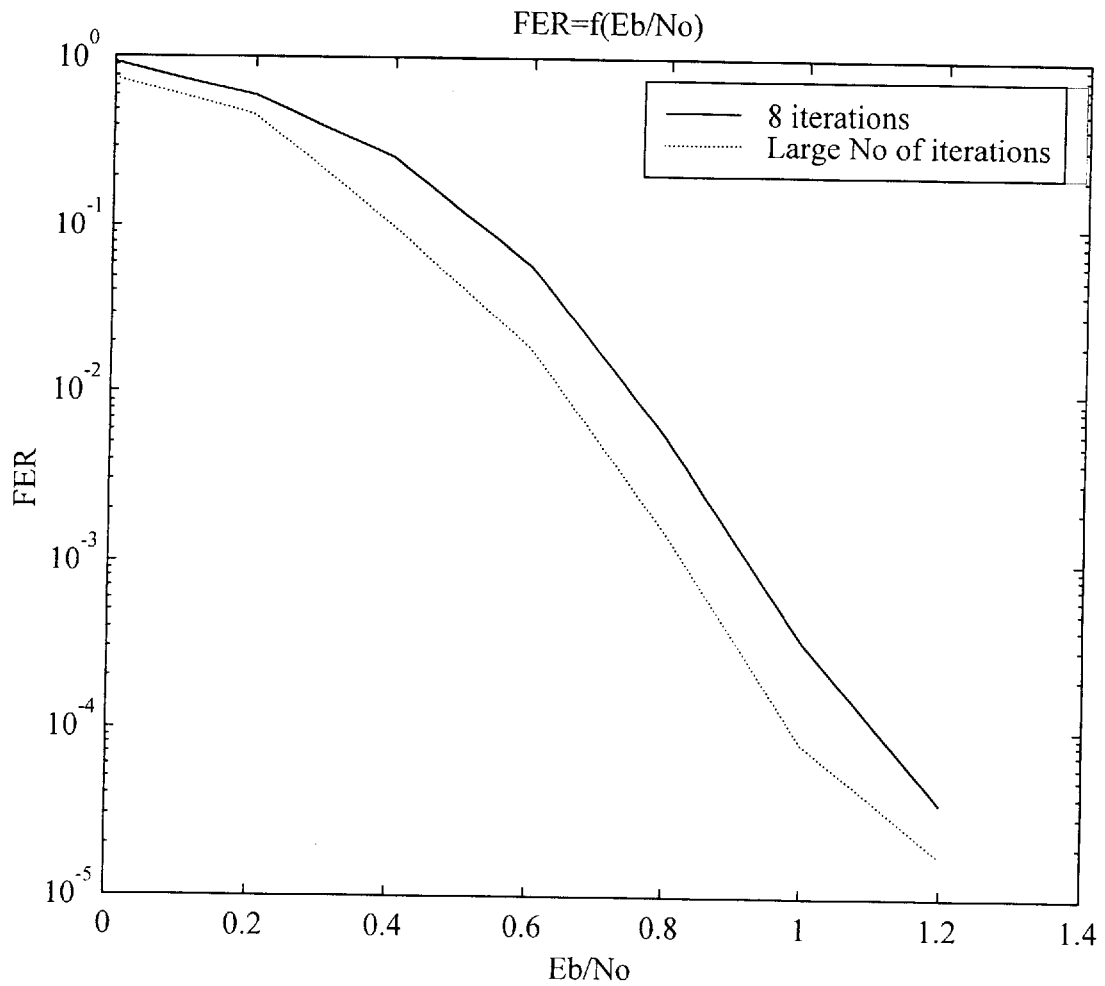
Figure 14:
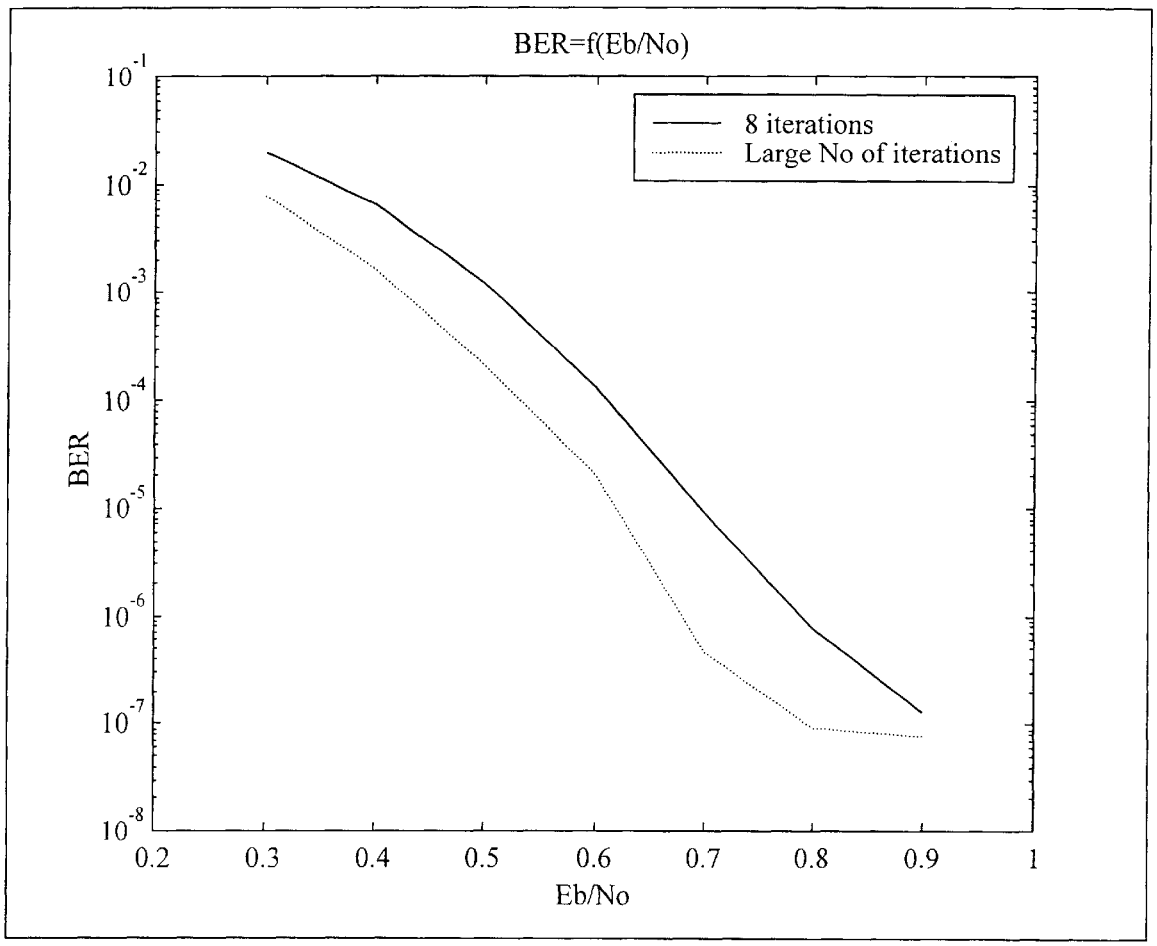
Figure 15:
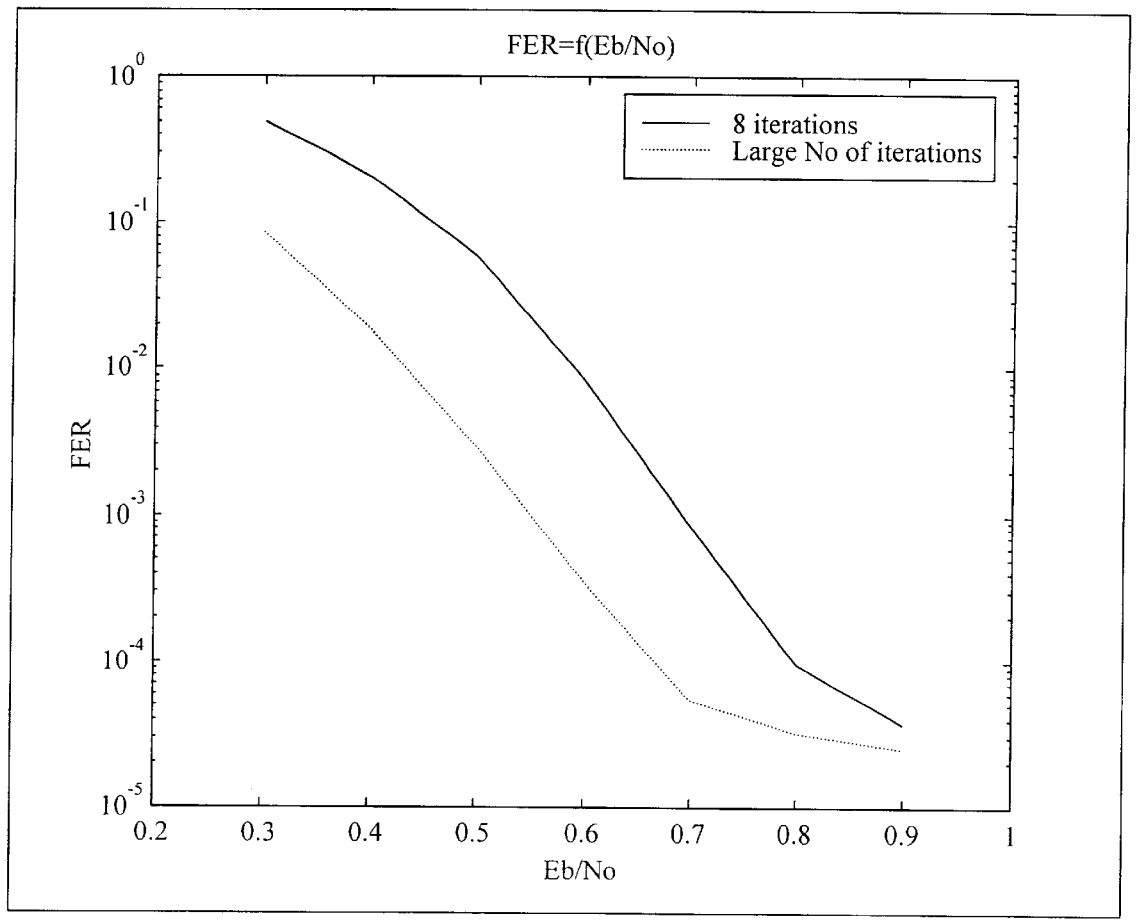
Figure 16:
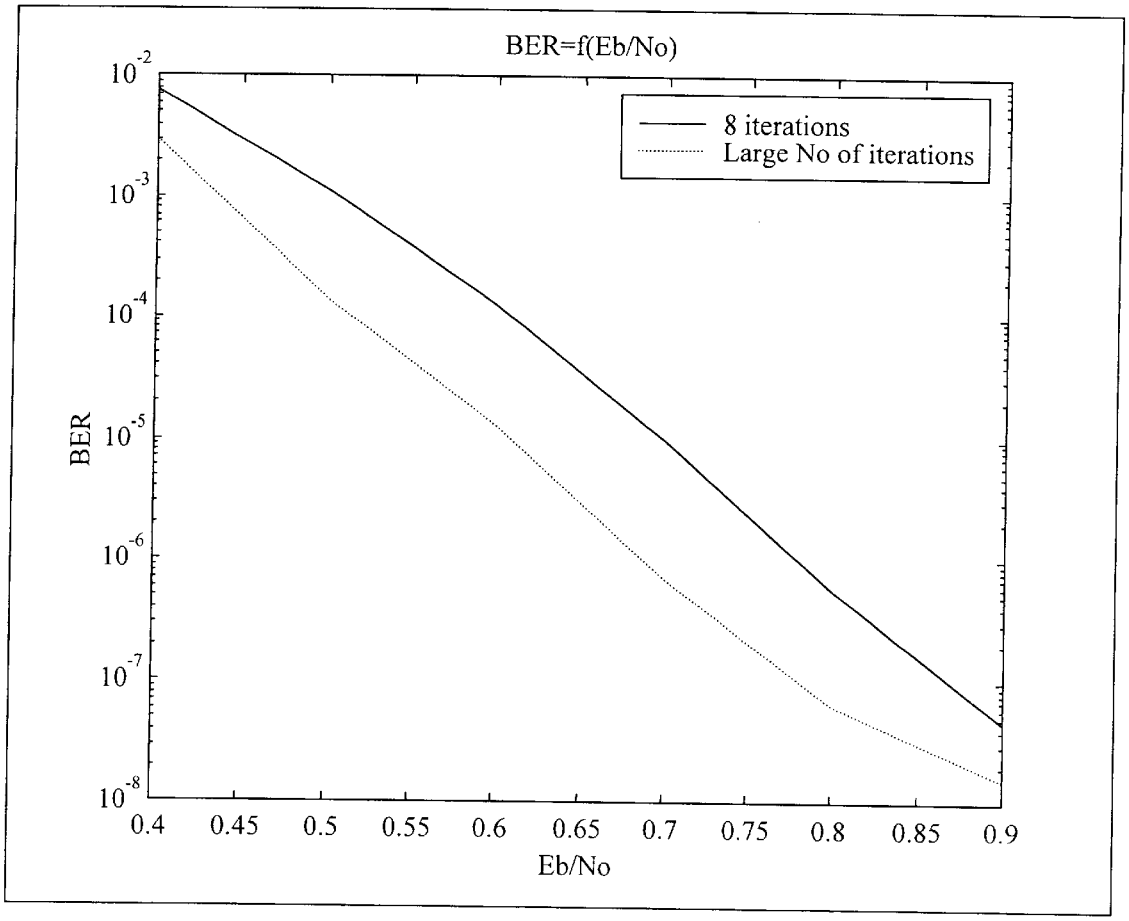
Figure 17:
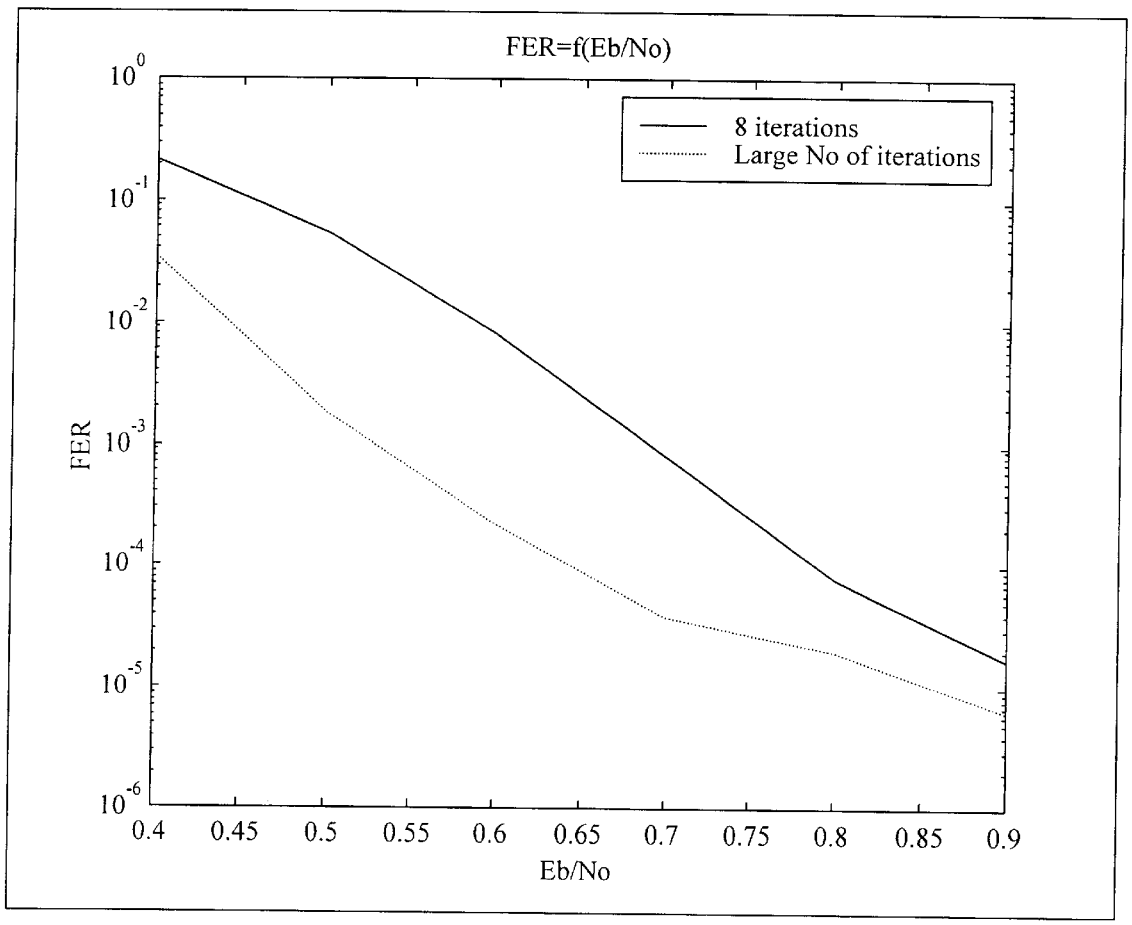
Figure 18:
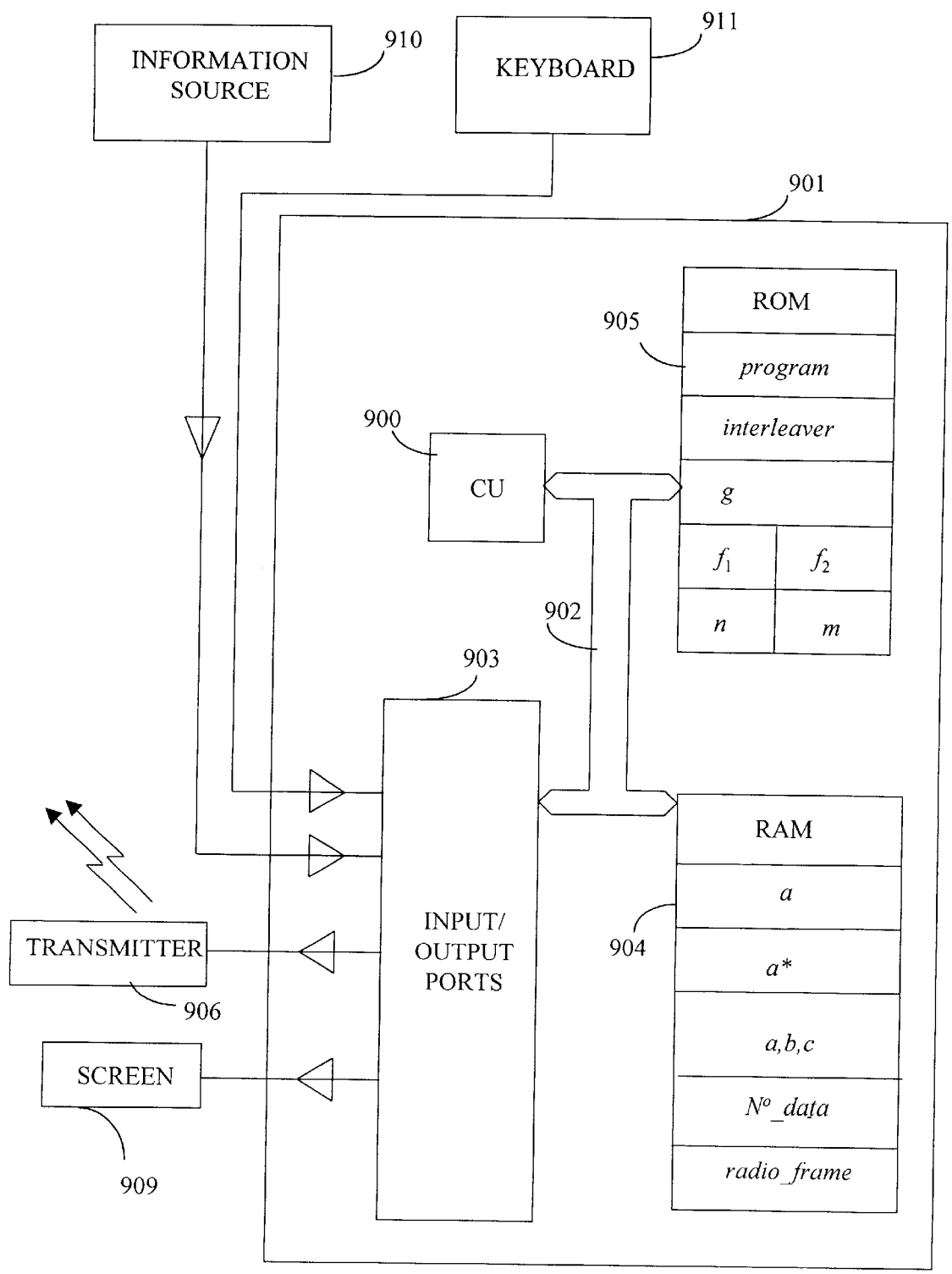
Figure 19:
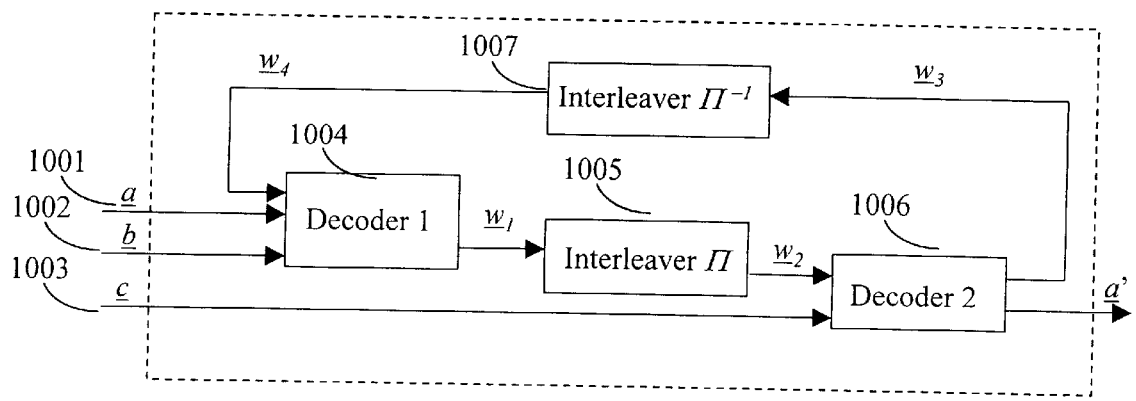
Figure 20:
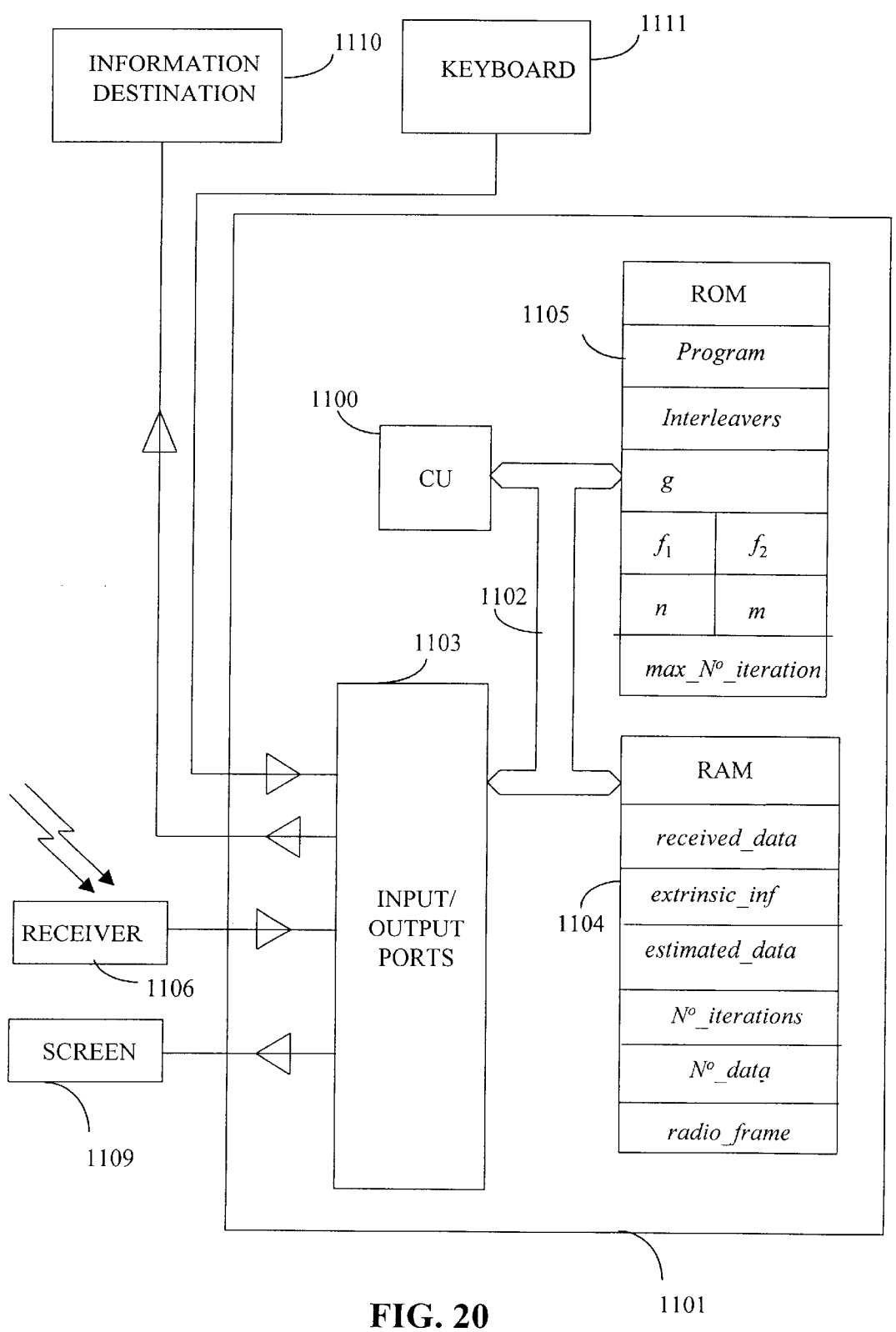
Figure 21:
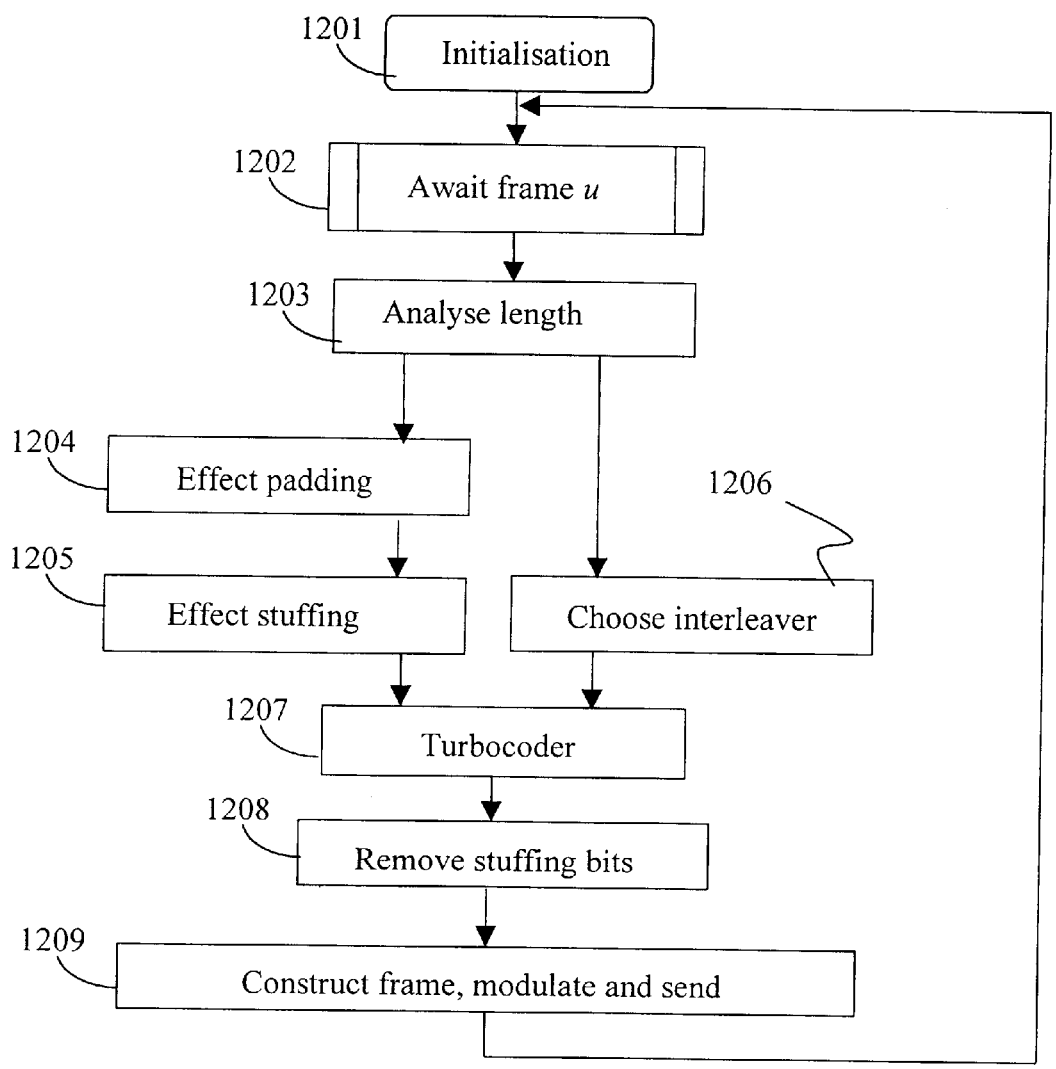
Figure 22:
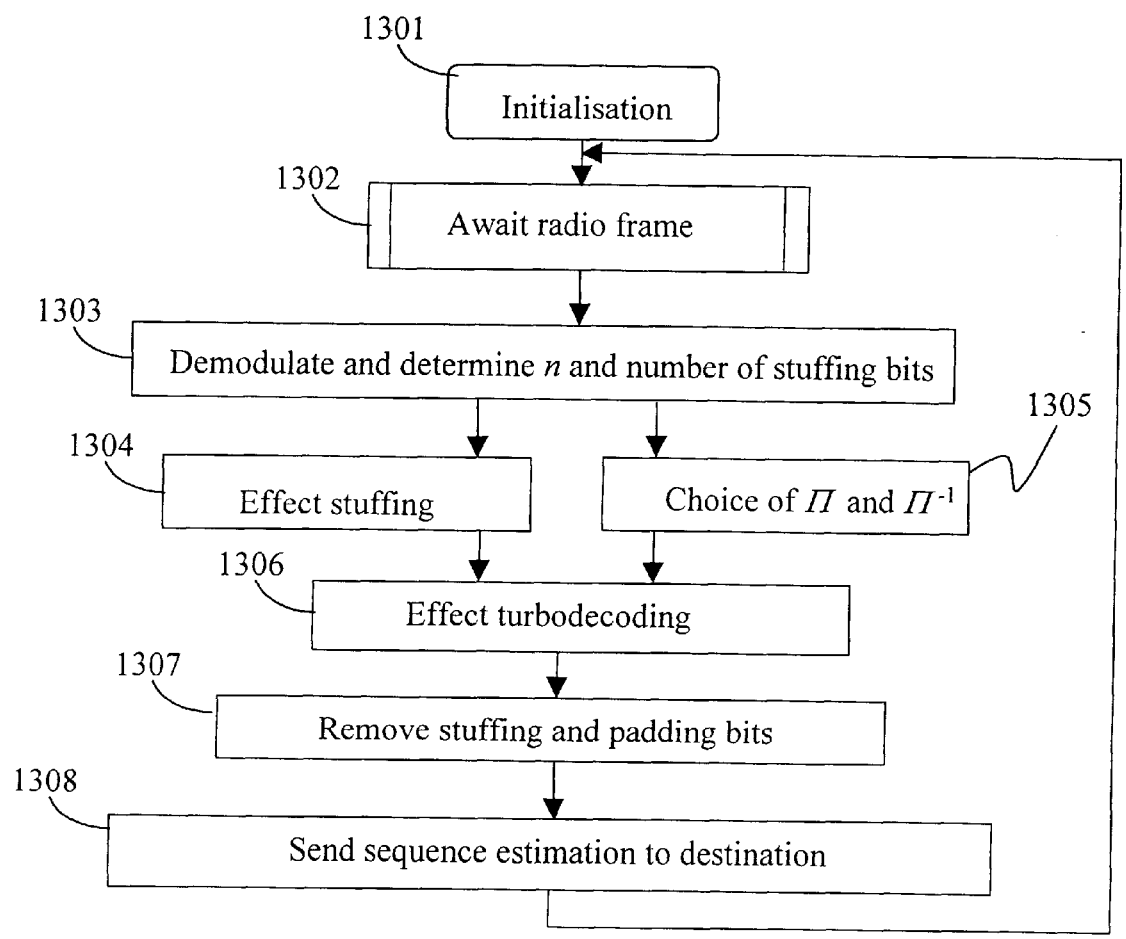

FIGS. 12 and 13 depict, for an interleaver of length 952 according to the λ=1 embodiment of the invention, the bit error rate (BER) and frame error rate (FER) curves after decoding as a function of the signal to noise ratio $E_b/N_o$) expressed in decibels, for two different numbers (8 and 195) of decoding iterations;

FIGS. 14 and 15 depict, for an interleaver of length 2415 according to the λ=1 embodiment of the invention, the bit error rate (BER) and frame error rate (FER) curves after decoding as a function of the signal to noise ratio ($E_b/N_o$) expressed in decibels, for two different numbers (8 and 195) of decoding iterations;

FIGS. 16 and 17 depict, for an interleaver of length 2415 according to the λ=1 embodiment of the invention, but improved in accordance with that which is stated below in section 7, the bit error rate (BER) and frame error rate (FER)

curves after decoding as a function of the signal to noise ratio ($E_b/N_o$) expressed in decibels, for two different numbers (8 and 195) of decoding iterations;

FIG. 18 depicts schematically a coding device adapted to implement the preferred embodiment of the present invention, FIG. 19 is a functional diagram of a turbodecoder, FIG. 20 depicts schematically a decoding device adapted to implement the preferred embodiment of the present invention, FIG. 21 depicts an operating flow diagram of the coding device illustrated in FIG. 18, FIG. 22 depicts an operating flow diagram of the decoding device illustrated in FIG. 20.

Before describing a particular embodiment of the present invention, a mathematical presentation of its functioning, explained with examples, is given below.

1. General Definitions

Figure 1:
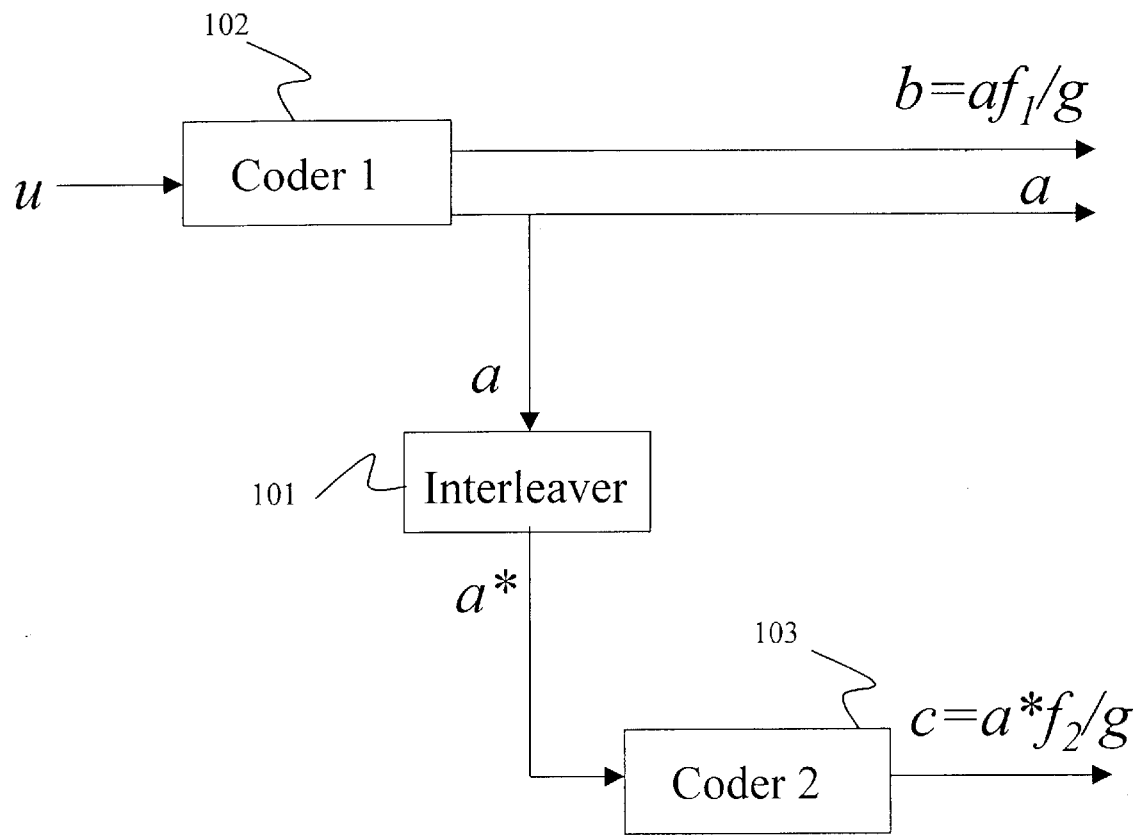
FIG. 1 is a functional diagram of a turbocoder using an interleaver able to have the property RZ.

A turbocoder of ratio 1/3 is characterised by four polynomials: $g(x)$ and $g^*(x)$ (referred to as feedback polynomials), $f_1(x)$ and $f_2(x)$, a frame length n and an interleaver, FIG. 1 illustrates a turbocoder of ratio 1/3.

An incoming information item $u(x)$ is coded in three sequences:

a first sequence $a(x)$ is the initial sequence $u(x)$ supplemented by padding bits (a so-called padding operation) in order to ensure divisibility of the sequence supplemented by the feedback polynomial $g(x)$, a second sequence $b(x)=a(x) \cdot f_1(x)/g(x)$, these first two sequences being obtained at the output of a first elementary coder 102, a third sequence $c(x)=a^*(x) \cdot f_2(x)/g^*(x)$ where $a^*(x)$ is the polynomial description of the interleaved version of $a(x)$, and where $g^*(x)$ must then satisfy the factorisation conditions as mentioned above.

The second sequence $b(x)$ coded by the first elementary coder 102 is obtained in a shift register effecting a multiplication by $f_1$ and a division by the first feedback polynomial g used in the turbocode. $f_1$ and g are generally chosen with a degree of at most 4 in order to preserve sufficiently simple coding and decoding.

The calculation of the third sequence $c(x)$, obtained at the output of a second elementary coder 103, uses first of all an interleaver 101 which mixes the coefficients of the sequence a in order to produce an interleaved sequence $a^*$, and a shift register effecting a multiplication by $f_2$ and a division by the second feedback polynomial $g^*$. At the output of the second elementary coder 103 a sequence $c=a^* \cdot f_2/g^*$ is obtained. As with $f_1$ and g, it is generally wished for $f_2$ and $g^*$ to have a degree of at most 4 in order to keep a sufficiently simple coding and decoding. So that $c(x)$ is of finite length, an interleaver guaranteeing return to zero is used, as defined above.

As stated above, an interleaver which guarantees that, for any polynomial $a(x)$ divisible by $g(x)$, the corresponding interleaved polynomial $a^*(x)$ is also divisible by $g^*(x)$ is known as an RZ (Return to Zero) interleaver.

The present invention proposes RZ interleavers producing turbocodes having a good minimum distance. The method of specifying these interleavers is described below. Let it be assumed first of all that $g(x)=g^*(x)$.

A description will be given here firstly of the class of interleavers which preserves after interleaving the divisibility of a sequence $a(x)$ by the polynomial $g(x)$. Then the conditions will be presented which are entailed in the construction of the interleavers according to the present invention. Finally, these elements will be combined in order to produce an effective interleaver.

It is, amongst other things, in order to confer, on all the information bits in a frame, an equal or approximately equal probability of error after decoding, that it will be chosen to construct RZ interleavers.

It can be demonstrated that an interleaver guarantees that any polynomial $a(x)$ divisible by $g(x)$ is such that the corresponding interleaved polynomial $a^*(x)$ is also divisible by $g(x)$ if it can be expressed as follows:

1. The number n of binary characters on which it acts is a multiple of m(g) (often simply denoted m) which is the smallest integer such that the polynomial $g(x)$ divides the polynomial $(1+x^{m(g)})$. To do this, the sequence $a(x)$ is supplemented with zeros in order to achieve an acceptable length n. If the natural length of the sequence $a(x)$ is equal to $(r-1)m+s$, for a number s satisfying $m-1 \geq s \geq 1$, it can for example be supplemented by m-s zeros in the last m-s positions of the sequence $a(x)$.

2. Assuming then $n=r \cdot m$, there is associated with each sequence $$a(x) = \sum_{i=0}^{n-1} a_i x^i$$

a matrix A of size $r \cdot m$ (r rows and m columns), where the element in position (j,k), $0 \leq j \leq r-1$ and $0 \leq k \leq m-1$ is $a_{jm+k}$. A matrix S of size $r \cdot m$, where the element in position (j,k), $0 \leq j \leq r-1$ and $0 \leq k \leq m-1$ is $jm+k$ (see FIG. 10 for the case $r=8$, $m=7$) is also associated with all the sequences $a(x)$ divisible by the feedback polynomial $g(x)$.

3. From S a matrix $S^*$ is constructed by applying to S any combination of permutations of the following two types:

any permutation acting in any of the m columns of the matrix S, a permutation of the columns with each other, this permutation being an automorphism of the linear cyclic code of length m and with the generator polynomial g.

Such a matrix $S^*$ is illustrated in FIG. 11.

4. Let $S^*_{j,k}$ be the element in position (j, k) of the matrix $S^*$ thus obtained. It has been seen that $jm+k$ is the element in position (j, k) of the matrix S. The interleaver specified by $(S, S^*)$ is defined by the change from the sequence:

$$a(x) = \sum_{0 \leq j \leq r-1} \sum_{0 \leq k \leq m-1} a_{j,k} x^{jm+k}$$

to the sequence:

$$a^*(x) = \sum_{0 \leq j \leq r-1} \sum_{0 \leq k \leq m-1} a_{jm+k} x^{s^*_{j,k}}$$

With each sequence $a^*(x)$ there is associated a matrix $A^*$ of size $r \cdot m$ (r rows and m columns) where the element in position (j,k), $0 \leq j \leq r-1$ and $0 \leq k \leq m-1$ is the coefficient $a^*_{j,k}$ of $x^{jm+k}$ in $a^*(x)$.

In order to simplify the discussion, the consideration here is restricted to the case where no permutation of the columns with each other is used in order to produce $S^*$ from S. Because of this, all the numbers appearing in the same column of S and $S^*$ are identical. The general case can however be treated in a similar manner.

The conditions given above for an interleaver to be of the RZ type are then expressed as follows in terms of properties of the matrix $S^*$:

the residue modulo m of the elements of any column of $S^*$ is constant, let $(r_0, \ldots, r_{m-1})$ be the m-tuple of these residues; this m-tuple must be obtained from the m-tuple $(0, 1, \ldots, m-1)$ through the action of a permutation which is in the automorphism group of a binary cyclic code of length m and with the generator polynomial g(x), there are no restrictions on the order of the elements in a column of S*.

More generally, as stated above, the interleaver can transform any a(x) which is a multiple of g(x) into an a*(x) which is a multiple of g*(x) when g*(x) is compatible with g(x). The representation by the matrix S* of such an interleaver is similar to that which has just been stated but the conditions to be satisfied by S* are slightly different: the m-tuple $(r_0, \ldots, r_{m-1})$ must now be obtained from the m-tuple $(0, \ldots, m-1)$ through the action of a permutation which transforms the binary cyclic code of length m and with the generator polynomial g(x) into the binary cyclic code of length m and with the generator polynomial g*(x).

The remainder of the disclosure is given on the assumption that g(x)=g*(x), but it can of course be adapted to the case where these two polynomials are obtained one from the other by the action of a field automorphism as explained above. In the case g(x)=g*(x) it is therefore also possible to apply a permutation of the order in which the columns of S* appear, provided that this permutation is an automorphism of the cyclic code of length m generated by g(x).

The concept of span of a polynomial is introduced here, as well as its full span.

Given a polynomial a(x) having an even number of non-zero coefficients $$a(x) = \sum_{i \in I} x^i, I = \{i_1, i_2, \ldots, i_{2s}\}, i_r < i_{r+1},$$

the span sp(a) is defined as the sum of the integers $i_r$ with r even, minus the sum of the integers $i_r$ with r odd: sp(a)= $(i_2-i_1)+(i_4-i_3)+ \ldots +(i_{2s}-i_{2s-1})$.

This polynomial a(x) then being transformed by the second method described above into the polynomial a*(x), the span sp(a*) is calculated in an identical manner.

The full span fsp(a) is then defined as the sum of the span of a and the span of a*.

Assuming then an interleaver of the return to zero type defined by a matrix S*, and considering a sequence $$a(x) = \sum_{i \in I} x^i$$

where the non-zero elements are all in the same column k of the matrix A (all the i's have the same remainder k in their division by the number m of columns of A).

In this case, such a sequence a(x) is said to be homogeneous, and is divisible by g(x) if and only if it contains an odd number of non-zero elements.

It will then easily be understood that there exists k in the set $\{0, \ldots, m-1\}$, such that a(x) is divisible by $x^k$, and $a(x)/x^k$ is a polynomial in $x^m$: $v(x^m)=a(x)/x^k$. The polynomial v(x) will be referred to as the simplified version of a(x). Similarly, there exists k* in $\{0, \ldots, m-1\}$ such that a*(x) is divisible by $x^{k*}$ and $a*(x)/x^{k*}$ is a polynomial in $x^m$: $v*(x^m)=a*(x)/x^{k*}$. The polynomial v*(x) will be referred to as the simplified version of a*(x).

If a sequence a(x) is not homogeneous, it can be written as a sum of homogeneous sequences. This is because any sequence a(x) can be put in the form $$a(x) = \sum_{i=0}^{m-1} x^i a_i(x^m),$$

where each term of the sum is a homogeneous sequence. It will be said that the term $x^i a_i(x^m)$ is the $i^{th}$ homogeneous component of the sequence a(x).

It is then possible to establish that, if a(x) is a homogeneous sequence, knowledge of the full span fsp(v) of the corresponding simplified sequence makes it possible to obtain the weight of the coded sequence (a, b, c) obtained from the sequence a, when m is equal to $2^t-1$ where t is the degree of g(x).

For example, with $g(x)=1+x^2+x^3$ (which implies m=7), $f_1(x)=1+x+x^2+x^3$, $f_2(x)=1+x+x^3$, for a(x) a homogeneous sequence of weight 2, the weight of the coded sequence (a(x), b(x), c(x)) is still 4·fsp(v)+6.

More generally, if a(x) is a homogeneous sequence comprising an even number equal to w, of non-zero elements, and if v(x) is the associated simplified polynomial, with $f_1(x)$, $f_2(x)$ and g(x) as previously defined, the weight of the corresponding coded sequence is equal to 4 fsp(v)+3.w.

Moreover, it is clear that a lower limit exists for the full span fsp(v). It is equal to the Hamming weight of the polynomial v(x) (equal to the weight of a(x)).

It is then possible, from these comments, to form a table supplying, for various Hamming weights of the homogeneous sequence a (denoted $W_H(a)$), the Hamming weights $W_H(a,b,c)$ of the coded sequences (a b c) as a function of the full span fsp(v) (see FIG. 2).

By way of example, as can be seen in FIG. 2, if $W_H(a)$ is equal to 2 and a minimum distance at least equal to 34 is required, it is essential for the corresponding simplified sequence v to have a full span fsp(v) equal to at least 7. On the other hand, if the Hamming weight $W_H(a)$ of the sequence a is 6, the condition of having a minimum distance at least equal to 34 produces no additional condition on the full span, this distance condition then always being fulfilled.

2. Principles of the Solution ($\lambda>1$)

We shall now focus on the general case where $\lambda$ is larger than 1. The case $\lambda=1$, which is interesting in itself, will be discussed further below.

Our goal presently is to show how to choose the parameters defining an interleaver, on the basis of reasonable criteria which should confer to such an interleaver a good efficiency, so that the associated turbocode will present a very low bit error rate.

Starting then from a matrix A of type (r, m) associated with a sequence a(x) chosen as a multiple of a divisor polynomial g(x) of $x^m+1$, each column of A is divided into $\lambda$ sub-columns denoted $A_{\lambda_1}^{\lambda_2}$ (see FIG. 3) and referred to as "column sub-sequences".

For the purpose of using, on each sub-column thus determined, a wheel interleaver, as defined previously, it is necessary for the value r/$\lambda$ not to be a prime number (otherwise it is not possible to represent this sequence in the form of a matrix with at least two rows and two columns). It is therefore possible to write r/$\lambda$=R·M with M$\geq$2. In addition, it will be seen subsequently that the methods for constructing interleavers according to the present invention require R$\geq$M.

By nature the coefficients $a_i$ of a sub-column $A_{\lambda_1}^{\lambda_2}$ will have as indices: $i_0, i_0+m, i_0+2m, \ldots, i_0+m(r-1)/\lambda$ with $i_0=\lambda_1(m \ r/\lambda)+\lambda_2$.

In order to keep reasonable notations, any such column sub-sequence will be represented by $$y(x) = \sum_{i=0}^{r/\lambda-1} (a_{i0+mi})x^i$$

or, positing $y_i = a_{i0+mi}$, by $$y(x) = \sum_{i=0}^{RM-1} y_i x^i$$

with and $r/\lambda = RM$.

There is then associated with the set of all such sequences $y(x)$ a matrix U with R rows and M columns which will fulfil the same role for the "microscopic" interleavers as the matrix S for the "macroscopic" interleaver. The action of a microscopic interleaver on the set of sequences $y(x)$ is represented by another matrix U*, with R rows and M columns. This matrix U* fulfils the same role for the microscopic interleavers as the matrix S* for the macroscopic interleavers.

It should be noted that these microscopic interleavers do not have to ensure "Return to Zero" in any way, since the divisibility condition is to be verified at the level of the macroscopic interleaver. However, it is chosen to restrict the permutations U→U* to those obtained by effecting a circular permutation in each column of U. Such a macroscopic interleaver is referred to in the remainder of the description as a wheel interleaver (by analogy with parallel numbered wheels).

Because of the nature of a circular permutation, such a matrix U* (and therefore the wheel interleaver associated with U and U*) is completely defined by the knowledge of the amplitude of the permutation effected in each column. A wheel interleaver can therefore be defined by an M-tuple $h = (h_0, \ldots h_{M-1})$ comprising the amplitude values of the circular permutation downwards effected in each column of U in order to obtain U*.

It should be stated for the remainder that this type of wheel interleaver will be used to interleave (permute) the elements of a column sub-sequence of A. Given the way in which the number of columns of A have been chosen, the property of return to zero (RZ) of the resulting macroscopic interleaver will also be supplied. As stated above, this RZ property remains ensured if there is applied a modification of the order in which the columns of A appear provided that this modification is an automorphism of the cyclic code of length m and generator polynomial g(x).

This technique is the first of the above mentioned three techniques for producing effective interleavers.

For example, in the case R=M=7, which corresponds to column sub-sequences of length 49 (having 49 elements), to permit the turbocode generated a minimum distance equal to 34, it is necessary for each microscopic interleaver U→U* to guarantee that fsp(y) is greater than or equal to 7, for each simplified sequence y of Hamming weights equal to 2, and a full span fsp(y) greater than or equal to 6 for each simplified sequence with a Hamming weight equal to 4.

With $R \geq M \geq 2$, it is possible to demonstrate that any wheel interleaver U→U* of size RM described by an M-tuple h as defined above, has the property that all the simplified sequences $y(x)$ with a Hamming weight equal to 2 have their full span fsp(y) greater than or equal to the value M provided that the M elements of h are of different values (which amounts to stating that circular permutations with different values must be applied to all the columns of the matrix representation of the column sub-sequence).

Returning then to the case R=M=7, there are a priori $7^7$ combinations of circular permutations possible on the 7 columns, but in fact only 7!, that is to say 5040, satisfy the condition fsp(y) greater than or equal to 7 for each simplified sequence $y(x)$ of weight 2.

Assuming then that $T_1$ and $T_2$ are two "circulant" matrices (a matrix in which each column is derived from the previous one by shifting (rotation) by one notch downwards) of type M×M, such that the first column of $T_1$ is $[1,-2,1,0,\ldots,0]'$ and the first column of $T_2$ is $[2,-2,0,\ldots,0]'$, it is possible to demonstrate the following property: with $R \geq M \geq 6$, any wheel interleaver U→U* of size RM described by an M-tuple h as defined above, has the property that all the simplified sequences $y(x)$ with a Hamming weight equal to 4 have their full span fsp(y) greater than or equal to the value 6 provided that the remainders modulo R of $hT_1$ and $hT_2$ do not contain a null component.

Returning again to the case R=M=7, it is possible to determine the septuples h verifying both of the abovementioned properties. For example, for a null first component (no circular permutation of the first column), there are exactly 168 septuples satisfying these properties.

When in addition $h_1 = 1$ (circular permutation of the second column with an amplitude equal to one), there are 28 such septuples satisfying the two properties (see the table in FIG. 4).

For example, it can be shown that the following septuples satisfy the conditions stated:

h(1)=(0 6 4 3 1 2 5), h(2)=(0 5 1 6 2 4 3), h(3)=(0 4 5 2 3 6 1)

h(4)=(0 3 2 5 4 1 6), h(5)=(0 2 6 1 5 3 4), h(6)=(0 1 3 4 6 5 2), the last septuple being the last element in FIG. 4.

In another example (with M=5), if it is wished to obtain a turbocode having a minimum distance of 42, it can be seen in the table in FIG. 2 that this entails that, for sequences y of weight 2, the full span fsp(y) is greater than or equal to 9 and, for sequences of weight 4, the full span fsp(y) is greater than or equal to 8. It should also be noted that the condition fsp(y) $\geq 42$ is always verified for sequences with a weight 6 or more.

It is then sought to construct U→U* interleavers where U and U* are matrices with R rows and 5 columns. It is therefore necessary to specify wheel interleavers by 5-tuples $h=[h_0, h_1, h_2, h_3, h_4]$ of numbers $h_i$, between 0 and R−1 (including delimiters), such that the full span fsp(y) of any simplified sequence $y(x)$ of weight 2 is greater than or equal to 9 and the full span fsp(y) of any simplified sequence $y(x)$ of weight 4 is greater than or equal to 8 (see FIG. 2).

It can be verified that this is achieved for all the sequences $y(x)$ of weight 2, if and only if any two components $h_i$, $h_j$ of h are such that their difference modulo R is an absolute value strictly greater than 1 (neither zero, nor −1, nor 1).

In order to satisfy the condition for all the sequences of weight 4, it is possible to show a few conditions necessary for fulfilling the m-tuples h already fulfilling the condition for the sequences of weight 2, and being restricted to the case where the first component $h_0$ is zero (no circular permutation of the first column of U in order to obtain the first column of U*).

Let it be assumed in fact that $T_1, T_2, \ldots T_7$ are seven circulant matrices of type M×M, comprising respectively as first columns, for $T_1$ $[1, -2, 1, 0, 0]'$, for $T_2$: $[2, -2, 0, 0, 0]'$, for $T_3$: $[2,-1, -1, 0, 0]'$, for $T_4$: $[1, -1, -1, 1, 0]'$, for $T_5$: $[1, 1, -2, 0, 0,]'$, for $T_6$: $[1, 0, -2, 1, 0]'$, for $T_7$: $[1, -2, 0, 1, 0]'$.

A first necessary condition is that, for i=1 to 7, the remainder modulo R of $hT_i$ does not have any component equal to 0, 1 or −1.

Introducing a circulant matrix 5×5 $T_8$ of a first column [1, 1, −1, −1, 0 ]', a second necessary condition is that the remainder modulo R of $hT_8$ does not have any component equal to 1 or −1.

Introducing a circulant matrix 5×5 $T_9$ of a first column [1, −1, 1, −1, 0]', a third necessary condition is that the remainder modulo R of $hT_9$ does not have any component equal to 0 or 1.

It is then verified that, for R=26, these (necessary) conditions are also sufficient and that, for R equal to or less than 25, these conditions are never satisfied.

For R=26, there are 120 quintuples satisfying the conditions stated. These quintuples are all the non-zero multiples modulo 26 of the following 10 quintuples:

| 0 | 2 | 6  | 22 | 8  |
|---|---|----|----|----|
| 0 | 2 | 8  | 20 | 16 |
| 0 | 2 | 10 | 16 | 12 |
| 0 | 2 | 10 | 22 | 6  |
| 0 | 2 | 12 | 8  | 20 |
| 0 | 2 | 16 | 12 | 18 |
| 0 | 2 | 18 | 14 | 6  |
| 0 | 2 | 20 | 6  | 22 |
| 0 | 2 | 22 | 6  | 18 |
| 0 | 2 | 22 | 14 | 10 |

In the previous pages a method of constructing microscopic interleavers satisfying necessary conditions enabling the minimum distance of the turbocode generated by the associated macroscopic interleaver is greater than a predetermined value was explained.

Basing then on the wheel interleavers defined above for the sub-columns $A_{\lambda_1}^{\lambda_2}$, it is assumed here that an identical wheel interleaver U→U* is used for all the sub-columns. In this case the global interleaver is such that the corresponding turbocode contains, in fairly large numbers, sequences of very low weight. This is because, with $g(x)=1+x^2+x^3$, $f_1(x)=1+x+x^2+x^3$ and $f_2(x)=1+x+x^3$ as considered above, a polynomial of the form $a(x)=x^{7i} \cdot g(x)$ satisfies $a^*(x)=x^{7j} \cdot g(x)$, for a certain j. Consequently, the Hamming weight corresponding to the encoded sequence (a, b, c) is only 10, which is a fairly low value.

The concepts of span sp(a) and full span fsp(a) are defined here for trinomials $a(x)=x^i+x^j+x^k$ with i<j<k by the following values: sp(a)=k−i, and fsp(a)=sp(a)+sp(a*)

Following the action of a wheel interleaver on each of the sub-columns $A_{\lambda_1}^{\lambda_2}$, a matrix A* is obtained. As each sub-column $A_{\lambda_1}^{\lambda_2}$ permuted by a wheel interleaver keeps up to the present time the same relative position in A* as in A, this matrix A* is again represented by the same array, for example the one given in FIG. 5, as the matrix A.

For the purpose of avoiding certain coded sequences of low weight such as the ones of weight 10 mentioned above, the matrix A* obtained up to the present time will also be modified by permuting with each other the sub-columns of one and the same column.

It is then possible to show in examples that all the permutations permuting with each other the sub-columns of each column are not equivalent in terms of minimum distance of the turbocode obtained.

In particular, it is observed that it is desirable to avoid, in addition to the situation $a(x)=x^{7i} \cdot g(x)$, $a^*(x)=x^{7j} \cdot g(x)$, mentioned above, any situation of the type $a(x)=(x^i+x^j+x^k) \cdot g(x)$ and $a^*(x)=(x^{i^*}+x^{j^*}+x^{k^*}) \cdot g(x)$ since the weight of the corresponding coded sequence is equal to 30, and therefore strictly less than 34, which is the minimum distance required.

A permutation of the sub-columns of A* which avoids the first of the unfavourable situations which have just been mentioned is depicted in FIG. 6. The presence in FIG. 6 of the pair $(\lambda_1, \lambda_2)$ in the position occupied in FIG. 5 by the pair $(k_1, k_2)$ means that the sub-column $(A^*)_{k_1}^{k_2}$ is moved into the position previously occupied by the sub-column $(A^*)_{\lambda_1}^{\lambda_2}$. In particular, in the example given, the sub-column $(A^*)_0^1$ is moved into the initial position of $(A^*)_5^1$, the sub-column $(A^*)_0^2$ is moved into the initial position of $(A^*)_3^2$, the sub-column $(A^*)_0^3$ is moved into the initial position of $(A^*)_3^1$, . . . , the sub-column $(A^*)_1^0$ remains where it is, . . . , the sub-column $(A^*)_6^6$ is moved into the initial position of $(A^*)_1^6$.

Unfortunately, this permutation has the disadvantage of not avoiding the second unfavourable situation mentioned above. This is because, with q=r/l, g(x), $f_1(x)$, and $f_2(x)$ as above, the sequence $a(x)=(x^{3 \cdot q+2}+x^{5 \cdot q+3}+x^{6 \cdot q}) \cdot g(x)$ produces $a^*(x)=(x^3+x^{2q+2}+x^{6 \cdot q}) \cdot g(x)$, and it is verified that the corresponding coded sequence has a weight of 30.

Consider, on the other hand, the permutation of the sub-columns of A* with each other, which is given in FIG. 7. In this case the second unfavourable situation mentioned above is also avoided. As a consequence, the global interleaver according to FIG. 7 eliminates many sequences of weight ≦30 from the code and replaces them with sequences of weight ≧34.

Here are a few details on the way of finding permutations having this effect. For this purpose the representations in FIGS. 5, 6 and 7 are simplified and generalised. As a simplification the second number $l_2$ in each pair $l_1, l_2$ is omitted, since the value of $l_2$ is not modified by the permutations which are considered. As a generalisation, it is accepted that q can be strictly greater than the number of columns. With these two conventions and q=6, a permutation of the sub-columns with each other which has the desired effect is given in FIG. 8.

Figures 8, 9:
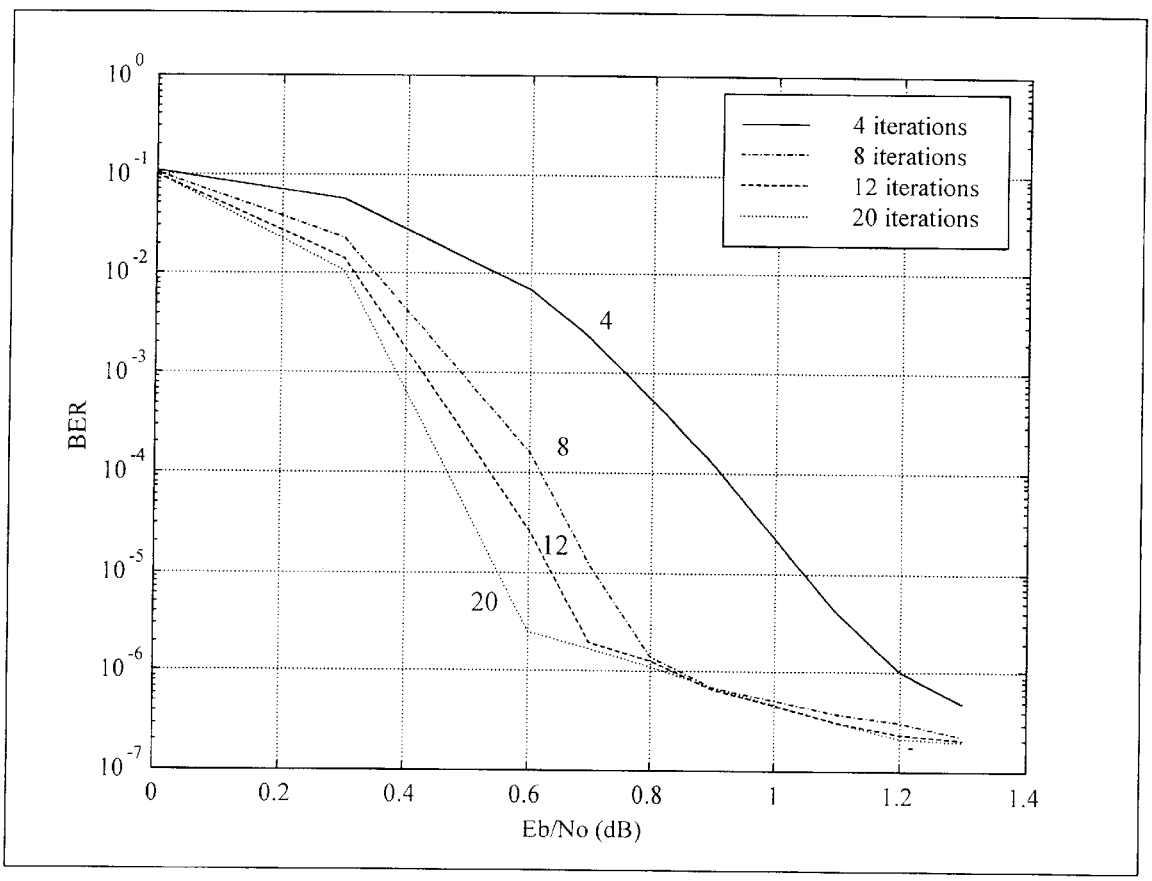
FIG. 8 illustrates a simplified representation of a permutation of the sub-columns of another matrix A.
FIG. 9 depicts, for an interleaver of length 2401 according to the invention, the bit error rate (BER) curves after decoding as a function of the signal to noise ratio ($E_b/N_o$) expressed in decibels, for four different numbers of decoding iterations.

The following property can then be demonstrated:

The second unfavourable situation mentioned above is avoided if it is impossible to find 9 pairs $(i_t, j_t)$, $(i_t, j_{t+2})$, $(i_t, j_{t+3})$ for t between 1 and 3, where the components $i_t$ and $j_t$, are integer numbers satisfying $0 \leq i_t \leq q-1$ and $0 \leq j_t \leq 6$ and where the additions are made modulo 7, such that when these pairs are considered as the row and column indices of the elements of the matrix given in FIG. 8, there are exactly three different integers each appearing in three of he nine positions thus obtained. The matrix depicted in FIG. 8 well avoids this unfavourable situation, as can be verified by a program in MATLAB language provided as an appendix.

So as to improve the turbocode still further, it is chosen to use a different wheel interleaver for each column of A.

Consider the case where each sub-column $A_{\lambda_1}^{\lambda_2}$ contains 49 elements, where A contains 7 columns and where each column contains 7 sub-columns. The length of the corresponding sequence a(x) is therefore equal to 49×7×7=2401.

It is chosen to construct the matrix A* by permuting together the sub-columns of each column in accordance with the rule depicted by FIG. 7. Next, with each column $A_{\lambda_1}^{\lambda_2}$ of 49 elements having a fixed value of $\lambda_2$, there is associated one and the same wheel interleaver 7×7 specified by a septuple h=[$h_0$, $h_1$, $h_2$, $h_3$, $h_4$, $h_5$, $h_6$].

The choice of the wheel interleaver associated with each sub-column is made as follows:

The columns of A and A* are numbered from 0 to 6, and the following septuples are used:

h(1)=(0 6 4 3 1 2 5), h(2)=(0 5 1 6 2 4 3), h(3)=(0 4 5 2 3 6 1)

h(4)=(0 3 2 5 4 1 6), h(5)=(0 2 6 1 5 3 4), h(6)=(0 1 3 4 6 5 2).

Each of these septuples specifies a wheel interleaver and the wheel specified by h(i) is used to permute all the sub-columns of the column i (i=1, . . . ,6) of A.

For the column of index 0, the sub-columns are permuted using one of the defined six septuples, for example h(1).

It was seen above that these septuples satisfy necessary conditions for the full span of a simplified sequence y(x) corresponding to a homogeneous sequence a(x) is greater than or equal to 7 if the Hamming weight of the sequence a(x) is equal to 2, and is greater than or equal to 6 if the Hamming weight of a(x) is equal to 4.

The reason why different wheel interleavers are chosen in each column of A is as follows. If this were not done, it would be possible to choose, for i fixed, a number j such that the sequence $a(x)=x^i(1 \times x^7)(1+x^{7j+2}+x^{7j+3})$ is interleaved as $a^*(x)=x^{i*}(1+x^{7j*})(1+x^2+x^3)$ by an interleaver of the type described by FIG. 7. In this case, the weight of the corresponding coded sequence could be strictly less than 34.

In another example, the sub-columns have a "length" of 117 elements, and are placed in 13×9 matrices, having to be interleaved by 13×9 wheel interleavers. The global interleaver then permutes 117×49 that is to say 5733 bits of information.

In this case, for i between 1 and 12, the following 9-tuple is denoted h(i):

h(i)=(0 i 5i 7i 12i 8i 11i 9i 3i)

when all the values are calculated modulo 13. Each such 9-tuple completely defines a wheel interleaver (it should be stated that it gives, by each of its components, the amplitude of the rotation of each column of a matrix with 9 columns) which satisfies a full span condition fsp(y)≧9 for all the sequences a of weight 2, and fsp(y)≧8 for sequences a of weight 4, which makes it possible to hope for a minimum distance equal to 42 (see FIG. 2). For this purpose, use will be made for example of the different h(i)s in the 7 columns of A and a permutation of the columns with each other of the type described by FIG. 8 will be applied.

In this way a turbocode is obtained adapted to code binary sequences of length 5733 and specified as stated above by $g(x)=1+x^2+x^3$, $f_1(x)=1+x+x^2+x^3$ and $f_2(x)=1+x+x^3$.

Simulations have been carried out in the case where an interleaver of length 2401 is used (the first example above). These are illustrated by FIG. 9, which gives, for four different numbers of decoding iterations, the bit error rate (BER) as a function of the signal to noise ratio per bit (Eb/No expressed in dB). It is found that the gain is very significant for signal to noise ratios which are already very low, and that the main part of the gain is obtained after 8 iterations.

It is clear that, compared with the interleavers normally used, the interleaver proposed in the present invention offers the major advantage of guaranteeing the simultaneous return to zero of the two elementary coders whilst guaranteeing a good code distance distribution, which is an advantageous factor when the signal to noise ratio per bit En/No is high.

3. Principles of the Solution (λ=1)

We now examine the preferred embodiment of the invention defined by λ=1, with, once again, the goal of choosing the parameters of such an interleaver in a way which should confer to the associated turbocode a very low bit error rate.

To achieve its goal, one associates to the set of all binary sequences $$z(x) = \sum_{i=0}^{r-1} z_i x^i,$$

where, r=RM, a matrix U with R rows and M columns which has as the element in position (j, k) the number jM+k, for j between 0 and R−1 (including delimiters) and k between 0 and M−1 (including delimiters).

For example, for R=7 and M=5, r=RM=35, and U is illustrated by:

$$U = \begin{vmatrix} 0 & 1 & 2 & 3 & 4 \\ 5 & 6 & 7 & 8 & 9 \\ 10 & 11 & 12 & 13 & 14 \\ 15 & 16 & 17 & 18 & 19 \\ 20 & 21 & 22 & 23 & 24 \\ 25 & 26 & 27 & 28 & 29 \\ 30 & 31 & 32 & 33 & 34 \end{vmatrix}$$

From an M-tuple $h=[h_0, \ldots h_{M-1}]$, a circular permutation of amplitude $H_j$ for the j-th column of U is then performed on the columns of the matrix U.

The matrix obtained is denoted U*. In this way, if U is as defined above and the M-tuple h is equal to [0 2 5 1 3], then the matrix U* is given by $$U^* = \begin{vmatrix} 0 & 26 & 12 & 33 & 24 \\ 5 & 31 & 17 & 3 & 29 \\ 10 & 1 & 22 & 8 & 34 \\ 15 & 6 & 27 & 13 & 4 \\ 20 & 11 & 32 & 18 & 9 \\ 25 & 16 & 2 & 23 & 14 \\ 30 & 21 & 7 & 28 & 19 \end{vmatrix}$$

With the pair (U, U*), or in an equivalent manner with the M-tuple h, there is then associated the interleaver which produces, from any sequence $z(x)=z_0+z_1x+\ldots+Z_{34}x^{34}$ the interleaved sequence $z^*(x)=z_0+z_1x^{26}+z_2x^{12}+\ldots+Z_{34}x^{19}$, which can also be written in the form $z^*(x)=z_0+z_{11}x+z_{27}x^2+\ldots+z_{14}x^{34}$.

A wheel interleaver of size RM, defined by the M-tuple $h=[h_0, \ldots, h_{M-1}]$, produces from the sequence $$z(x) = \sum_{K=0}^{M-1} x^K z^{(K)}(x^M),$$

where the $z^{(K)}(x)$ are polynomials of degree R−1, an interleaved sequence $$z^*(x) = \sum_{K=0}^{M-1} x^{K-h_K M} z^{(K)}(x^M),$$

modulo $X^{RM}-1$.

Because of the nature of a circular permutation, such a matrix U* (and therefore the wheel interleaver associated with U and U*) is completely defined by the knowledge of the amplitude of the permutation performed in each column.

It should be noted here by way of clarification that the numbers of columns in the matrices S and S* depend on the polynomial g(x), that the permutations in the columns of S for producing S* are any permutations and that the transformation from S into S* can comprise permutations of the columns with each other.

On the other hand, the number of columns of U and U* does not depend on the polynomial g(x), the permutations in the columns of U for obtaining U* must be circular permutations and, preferably, the transformation of U into U* does not include any permutation of the columns with each other.

It should also be noted, again in order to clarify, that the pairs (S, S*) and (U, U*) define permutations, whilst A and A* are simply the representations in matrix form of the binary sequences a(x) and a*(x) respectively.

Several uses of wheel interleavers can be envisaged. In one of them, corresponding to an advantageous implementation of the invention, each column of the matrix A is interleaved by a wheel interleaver, and then undergoes a circular permutation.

The class of turbocoders having $g(x)=1+x^2+x^3$ (which implies m (g)=7), $f_1(x)=1+x+x^3$ and $f_2(x)=1+x+x^2+x^3$ is taken as an example. It will also be assumed that n can be written as $$n=R \, M \, m(g)$$

where R is a prime number which satisfies $R \geq M$.

These numbers R and M are the dimensions of the wheel interleavers used as components in order to construct a turbocode interleaver. If with m (g)=7, R=23 and M=15 are chosen, n will be equal to 23×15×7=2415, and if R=17 and M=8 are chosen, n will be equal to 952. As stated above, an RZ interleaver can be represented by a matrix S* of the type r·m. Therefore, for these two sets of parameters, r=RM=345 for n=2415 and r=136 for n=952.

In order to specify which permutation of a column of S produces a corresponding column of S*, a 3-step procedure is used.

A first step is to choose a wheel interleaver of size R·M which is efficient in terms of full span, as defined above.

A second step consists of using this efficient wheel interleaver $d_i$ times, for a good choice of $d_i$'s, in the $i^{th}$ column of A, for i=0, . . . , m−1.

A third step consists of applying a circular permutation with a well-chosen amplitude $e_i$ to the $i^{th}$ column of A.

g(x), $f_1$ (x), $f_2$ (x), n, R and M therefore being given, the interleavers are therefore specified by a) an M-tuple $h=[h_0, \ldots, h_{M-1}]$, b) an m-tuple $d=[d_0, \ldots d_{m-1}]$, c) an m-tuple $e=[e_0, \ldots e_{m-1}]$.

The choice of h is made so as to be effective for the information items a (x) having only one non-zero homogeneous component and given h, m-tuples d and e are then chosen in order to be effective for information items a (x) having several non-zero homogeneous components.

4. Selection of h ($\lambda$=1)

Let g(x), $f_1$ (x) and $f_2$ (x) be as defined in section 2, let $a(x)=x^k a^{(k)}(x^m)$, $0 \leq k \leq m-1$, a sequence of homogeneous information, and let v=[a, b, c] be the triplet of coded sequences produced from a(x) by means of a turbocoder using an RZ interleaver. It is not difficult to see that the Hamming weight $W_H(V)$ of v is equal to:

$$4fsp(a^{(k)}(x))+3W_H(a^{(k)}(x)).$$

More generally, if g(x) is a primitive polynomial of degree p and for i=1, 2, $f_i$ (x) has the form $$1+\sum_{j=1}^{p-1} f_{i,j}x^j + x^p, f_{i,j} \in \{0, 1\},$$

m is equal to $2^{p-1}$ and the Hamming weight of a coded sequence v produced by a homogeneous information sequence $a(x)=x^{(k)}(x^m)$ is equal to:

$$2^{p-1}fsp(a^{(k)}(x))+3W_H(a^{(k)}(x)).$$

In Table 1, the weight of v is given for several values of $W_H (a^{(k)} (x))$ and fsp $(a^{(k)} (x))$. It can be seen, for example, that in order to produce a minimum weight of 34, an RZ interleaver must effect (for any k) fsp $(a^{(k)} (x)) \geq 7$ if $W_H(a^{(k)} (x))=2$ and fsp $(a^{(k)} (x)) \geq 6$ if $W_H (a^{(k)} (x))=4$. There are no conditions imposed on fsp $(a^{(k)} (x))$ if $W_H (a^{(k)} (x)) \geq 6$.

TABLE 1

Weight of homogeneous coded sequences (Table 1 is a table of the weights of encoded homogeneous sequences (a b c) as a function of the full span of the simplified sequence v)

| $W_H (a^{(k)} (x)) = 2$ | | | | | | | | | | | |
|---|---|---|---|---|---|---|---|---|---|---|---|
| fsp $(a^{(k)} (x))$ | 2 | 3 | 4 | 5 | 6 | 7 | 8 | 9 | 10 | 11 | 12 |
| $W_H(v (x))$ | 14 | 18 | 22 | 26 | 30 | 34 | 38 | 42 | 46 | 50 | 54 |
| $W_H (a^{(k)} (x)) = 4$ | | | | | | | | | | | |
| fsp $(a^{(k)} (x))$ | 4 | 5 | 6 | 7 | 8 | 9 | 10 | 11 | | | |
| $W_H(v (x))$ | 28 | 32 | 36 | 40 | 44 | 48 | 52 | 42 | | | |
| $W_H (a^{(k)} (x)) = 6$ | | | | | | | | | | | |
| fsp $(a^{(k)} (x))$ | 6 | 7 | 8 | 9 | | | | | | | |
| $W_H(v (x))$ | 42 | 46 | 50 | 54 | | | | | | | |

We are now ready to specify the permutation to be applied to $S_k$, the $k^{th}$ column of S, in order to produce $S^*_k$, the $k^{th}$ column of S*. In fact $S_k$ has the form $$S_k=[k,k+m,k-2m, \ldots, \ldots ,k+(RM-1)m]^T,$$

where T represents the transposition. Given a wheel interleaver R×M specified by a matrix U* (or in an equivalent manner by the corresponding h), let $u=[u_0, \ldots, u_{RM-1}]$ the rescheduling of the RM integers 0, 1, . . . ,RM−1 obtained when the elements of U* are read row by row. Using this wheel, there is associated with $S_k$ the new column $$S'_k=[k+u_0m,k+u_1m, \ldots k+u_{RM-1}m]^T.$$

If, for example, k=3, R=7, M=5 and the matrix U* is the one considered above, there is obtained $$S'_3=[3,3+26m,3+12m, \ldots ,3+24m,3+5m,31m, \ldots ,3+19m]^T$$

S' is used to represent the matrix in which, for $0 \leq k \leq m-1$, the $k^{th}$ column is $S'_k$. In the following section, it is discussed which circular permutations it is necessary to apply to the columns of S' in order to obtain S*. Here it is discussed what choice of U* or, in an equivalent fashion, of the M-tuple h defining U*, is effective when $a(x)=x^k a^{(k)}(x^m)$ with g, $f_1$ and $f_2$ as given above, is applied.

The simplified version of $a^{(k)}(X^m)$, will be represented by z(x) and the corresponding coded sequence by v. In this case (where, it should be stated, it is assumed that R is a prime number), the following properties can be demonstrated:

Property $P_1$: Assume that $R \geq M \geq 2$. Any sequence z(x) of Hamming weight equal to 2 and interleaved by a wheel interleaver of size R×M specified by an M-tuple h will satisfy fsp $(z) \geq M$ when all the residues modulo R of the components of h are different.

Property $P_2$: Assume that $R \geq M \geq 6$. Let T be the circulant matrix M×M whose first column is $[1 \ -2 \ 1 \ 0 \ \ldots \ 0]^T$. Any sequence z(x) of Hamming weight equal to 4 and interleaved by a wheel interleaver of size R×M specified by an M-tuple h will satisfy fsp $(z) \geq 6$ if h satisfies the property $P_1$ and the residues modulo R of the components of h T are non-zero.

Property $P_3$: Assume that $R \geq M \geq 8$. Consider then the matrices $T_i$, $i=1, \ldots, 6$ of type M×M and circulant and whose first columns are respectively:

$[1 \ -1 \ -1 \ 1 \ 0, \ldots, 0]^T$ for $T_1$, $[1 \ -1 \ -1 \ 1 \ 0, \ldots, 0]^T$ for $T_1$, $[1 \ 0 \ -2 \ 1 \ 0, \ldots, 0]^T$ for $T_3$, $[1 \ -2 \ 0 \ 1 \ 0, \ldots, 0]^T$ for $T_4$, $[2 \ -1 \ -1 \ 0, \ldots, 0]^T$ for $T_5$, $[1 \ 1 \ -2 \ 0, \ldots, 0]^T$ for $T_6$, Any sequence z(x) of Hamming weight equal to 4 interleaved by a wheel interleaver of dimensions R×M specified by an M-tuple h will satisfy fsp(z)$\geq 8$ if h satisfies the properties $P_1$ and $P_2$, and if, for any i, $i=1, \ldots, 6$, the residues modulo R of the components of $hT_i$ are non-zero.

Property $P_4$: Assume that $R \geq M \geq 10$. Consider the 12 circulant matrices $T_i$, $i=1, \ldots, 12$ of type M×M whose first columns are respectively:

$[1 \ 1 \ -1 \ -1 \ 0, \ldots, 0]^T$ for $T_1$, $[1 \ -1 \ 0 \ 1 \ -1 \ 0, \ldots, 0]^T$ for $T_2$, $[1 \ -1 \ 0 \ -1 \ 1 \ 0, \ldots, 0]^T$ for $T_3$, $[1 \ 0 \ -1 \ -1 \ 1 \ 0, \ldots, 0]^T$ for $T_4$, $[1 \ -1 \ -1 \ 0 \ 1 \ 0, \ldots, 0]^T$ for $T_5$, $[1 \ 0 \ -1 \ 1 \ -1 \ 0, \ldots, 0]^T$ for $T_6$, $[1 \ -1 \ 1 \ 0 \ -1 \ 0, \ldots, 0]^T$ for $T_7$, $[1 \ 0 \ -2 \ 0 \ 1 \ 0, \ldots, 0]^T$ for $T_8$, $[1 \ 0 \ 0 \ -2 \ 1 \ 0, \ldots, 0]^T$ for $T_9$, $[1 \ -2 \ 0 \ 0 \ 1 \ 0, \ldots, 0]^T$ for $T_{10}$, $[1 \ 0 \ 1 \ -2 \ 0, \ldots, 0]^T$ for $T_{11}$, $[2 \ -1 \ 0 \ 1 \ 0, \ldots, 0]^T$ for $T_{12}$, Any sequence z(x) with a Hamming weight of 4 and interleaved by a wheel interleaver of dimension R×M specified by an M-tuple h will satisfy fsp $(z) \geq 10$ if h satisfies the properties $P_1$ to $P_3$ and if, for any i, $i=1, \ldots, 12$, the residues modulo R of the components of $hT_i$ are non-zero.

A similar property can be established to guarantee fsp (z)$\geq 12$ and can also be higher values of fsp (z).

Property $P_5$: Assume that $R \geq M \geq 6$. Consider the 3 circulant matrices $T_i$, $i=1, \ldots, 3$ of type M×M, whose first columns are respectively:

$[1 \ -3 \ 2 \ 0, \ldots, 0]^T$ for $T_1$, $[2 \ -3 \ 1 \ 0 \ 0, \ldots, 0]^T$ for $T_2$, $[1 \ -2 \ 2 \ -1 \ 0, \ldots, 0]^T$ for $T_3$, Any sequence z(x) with a Hamming weight of 6 interleaved by a wheel interleaver of dimension R×M specified by an M-tuple h will satisfy fsp(z)$\geq 8$ if h satisfies the property $P_1$ and if, for any i, $i=1, \ldots, 3$, the residues modulo R of the components $hT_i$ are non-zero.

It is also possible to demonstrate that there is no wheel interleaver which satisfies fsp $(z) \geq 9$ for all the z's with a Hamming weight of 6, whatever R and M.

When M is smaller than what is required in the properties $P_2$ to $P_5$, the conditions become more complex. In particular, for M=7 some of the conditions mentioned in the property $P_3$ now resemble "the residues modulo R of the components h are not equal either to 0, nor to 1, nor to −1".

Two examples are given here. With R=23 and M=15, the 15-tuple h=[0 1 19 8 17 21 18 16 10 3 15 6 5 11 9]

is one amongst the 1850 15-tuples on $\{0, \ldots, 22\}$ having $h_0=0$ and $h_1=1$ which satisfy the properties $P_1$ to $P_5$. Using Table 1, it is concluded that any homogeneous sequence, when it is interleaved, as explained above, by the wheel interleaver 23×15 specified by h will generate a coded sequence of weight $\geq 50$.

In an identical manner, with R=17 and M=8, the 8-tuple h=[0 1 4 9 5 2 7 11]

satisfies the properties $P_1$, $P_2$, $P_3$ and $P_5$. Using Table 1, it is concluded that any homogeneous sequence interleaved as explained above by the wheel interleaver 17×8 specified by h, will generate a coded sequence of weight$\geq 38$. This minimum value is produced by homogeneous sequences of weight 2.

A MATLAB program, referred to as GOODH.M and given in the Appendix, has been written in order to find, for a given M and for a prime number $R \geq M$, what are the M-tuples h which satisfy some of the properties $P_1$ to $P_5$. The philosophy has been to achieve, for a given R and M, the best possible minimum weight for the non-zero homogeneous sequences. Although the minimum distance achieved with the code is often strictly smaller than this minimum weight, the approach in a certain sense attempts to minimise the number of code words of low weight. This should favourably influence the distribution of total weight of the code.

Moreover, when R, as assumed here, is a prime number, the set $\{0, \ldots, R-1\}$ structured by the addition and multiplication modulo R has the structure of the Galois field GF(R). In this case, for any $d \in \{1, \ldots, R-1\}$, the M-tuple dhT will have no non-zero component modulo R if any only if the same property is true for hT. This property will be very useful subsequently.

5. Construction of a Distance Matrix ($\lambda$=1)

After having found a good h, the $i^{th}$ column of S* will be obtained by applying to the $i^{th}$ h column of S the permutation of the wheel type defined by $d_i$ h and then a circular permutation towards the amplitude minimum $e_i$.

The corresponding permutation of this $i^{th}$ column of S or the associated permutation of symbols in the $i^{th}$ column of A will be represented by the pair $(d_i, e_i)$.

The choice of these m pairs $(d_i, e_i)$ is made so that any two symbols of the information sequence a (x) which are close to each other become reasonably distant after interleaving.

This is already achieved for the symbols in the same column of A since h was chosen to optimise this criterion and we therefore now concentrate on the pairs of symbols in different columns of A.

If the symbol $a_s$ (or respectively $a_t$) of a (x) is moved from position s to position s* (or respectively from position t to position t*) by the interleaver, it will be possible to attach to this pair (s,t) the cost function given by $$C(s,t) = |s-t| + |s^*-t^*|.$$

However, for the purpose of obtaining a more practical algorithm, the following procedure will be followed.

Consideration will be given to two symbols before interleaving and it is assumed that they appear in rows s and t of two different columns (the $i^{th}$ and the $j^{th}$, for example) in the matrix A introduced above. Assume that, under the action of the permutation specified by $(d_i, e_i)$, the first of these symbols, in row s, is moved to row s* and that under the action of the permutation $(d_j, e_j)$ the second of these symbols, in row t, is moved to row t*.

Our cost function for such a pair of symbols is chosen as being $$C(s,t) = |s-t| + |s^*-t^*|$$

where, given $(d_i, e_i)$ and $(d_j, e_j)$, s* and t* depend solely on s and t. In practice, a matrix $(R-1)^2 \times RM$ will be constructed which will be termed F. The $(R-1)^2$ rows of F will be indexed by the $(R-1)^2$ pairs (d,d'), where the elements d and d' satisfy: $1 \leq d, d' \leq R-1$ whilst the RM columns of F will be indexed by the RM integers $\epsilon = 1, \ldots, RM$.

In position ((d,d'), $\epsilon$), the element of F will be the minimum value of C(s,t) for all the s's and t's provided that the interleavers used are (d, e) and (d', e') and that $\epsilon = e' - e$.

The elements of F can therefore be interpreted as being the smallest (that is to say the least favourable) dissemination effects on a pair of symbols of a(x) each of them being in a different column of A, provided that the column of the first of these symbols is interleaved by (d, e), that the column of the second of these symbols is interleaved by (d', e') and that $\epsilon = e' - e$ is fixed.

A MATLAB program called DISTM.M has been written to construct this matrix F. It is given in the Appendix in the particular case where R=13 and M=9.

6. Method for Obtaining Good Turbocodes ($\lambda$=1)

Having specified a good wheel interleaver h of the type R×M, good M-tuples d and e will now be chosen so that the corresponding turbocode is good.

Here is the general idea of this selection.

d and e are chosen so that, for any i, j, $0 \leq i \leq j \leq m-1$, the element in position $((d_i, d_j), e_j - e_i)$ of F is reasonably large. With the interpretation of F given above, this means that any pair of information symbols will be disseminated with reasonably efficiency.

What makes the corresponding optimisation problem somewhat difficult is that, given for example the first two components $d_0$ and $d_1$ of d and the first two components $e_0$ and $e_1$ of e, which are chosen effectively, the third components $d_2$ and $e_2$ of d and e must be effective simultaneously with respect to $(d_0, e_0)$ and $(d_1, e_1)$.

In order to carry out a systematic search, a value called mini is chosen, and the interleaver defined by (d,e) is accepted if, for all the pairs of pairs $(d_i, e_i)$ and $(d_j, e_j)$ with $0 \leq i \leq j \leq m-1$, the element of F in position $((d_i, d_j), e_j - e_i)$ is>mini.

In practice, given h, first of all $(d_0, e_0) = (1, 0)$ is chosen. Next an attempt is made to find a certain pair $(d_1, e_1)$ such that, in position $((d_0, d_1), e_1 - e_0)$ the element of F is>mini.

If there is no such element, this means that mini cannot be achieved. If such a pair $(d_1, e_1)$ is found, then a pair $(d_2, e_2)$ is sought such that, in position $((d_0, d_2), e_2 - e_0)$ and $((d_1, d_2), e_2 - e_1)$, the element of F is>mini. The algorithm is continued in the same way, attempting to find $(d_i, e_i)$ for i=3, 4, 5 and 6.

This search can be refined by taking different values of mini which must be satisfied for different pairs (i, j). In particular, it is possible to choose the same value of mini for all the pairs (i, j) for which j−i has a fixed value. Since for m=7 and i<j, there are 6 different values of j−i, it is possible to choose 6 parameters mini (1), . . . , mini (6) and modify the systematic research in an appropriate fashion.

Each time a check is to be made, the parameter mini (j−i) which suits the specified values of i and j will be used. A MATLAB program called SELEC.M has been written to execute this search and is given in the Appendix.

7. Examples ($\lambda$=1)

With R=23 and M=15 (which implies n=2415) and h given as above by [0 1 19 8 17 21 18 16 10 3 15 6 5 11 9], the construction method described in section 4 was applied to obtain the 484×345 matrix denoted F and this matrix was used along the lines outlined in section 5. After a few attempts, a turbocoder was obtained for the following values of the parameters mini (i):

mini(1)=6, mini(2)=4, mini(3)=5, mini(4)=4, mini(5)=6, mini(6)=5.

This turbocoder is specified by d=[1, 3, 8, 11, 15, 9, 22], e=[0, 7, 269, 291, 194, 337, 120].

The performances of the corresponding turbocode were simulated on an additive Gaussian white noise channel and the results of this simulation are given in FIGS. 14 and 15. In both cases, the results obtained after 8 and 195 decoding iterations have been shown. Experience has shown that the best performance is essentially already obtained after thirty iterations.

Analysis of the results of simulations revealed the existence in this code of non-zero sequences whose Hamming weight is equal to 34. No lower Hamming weight sequence was found.

It is reasonable to think that 34 is the minimum distance of the code.

In a similar manner, with R=17, M=8 (which implies n=952) and h given as above by [0 1 4 9 5 2 7 11], the construction method described in section 4 was applied in order to obtain a 256×136 matrix called F and this matrix F was used along the lines outlined in section 5.

After a few attempts, a turbocoder was obtained with the following values of the parameters mini(i):

mini(1)=5, mini(2)=3, mini(3)=3, mini(4)=3, mini(5)=3, mini(6)=5.

This turbocoder is specified by d=[1, 7, 10, 2, 15, 12, 16], e=[0, 130, 58, 116, 76, 6, 148].

Its performance was simulated on the additive Gaussian white noise channel and the results of this simulation are given in FIGS. 12 and 13.

Analysis of the simulation results reveal the existence in this code of non-zero sequences with a Hamming weight equal to 34 but not less. It is reasonable to think that this is the minimum distance of the code.

8. Subsequent Improvements ($\lambda=1$)

In this section a few improvements are described which can be introduced as a variant to the method as previously described.

For a given choice of h, it is often possible to choose d and e even more effectively than described up till now.

In order to explain this, consider the interleaver of size 2415 constructed with R=23, M=15, h=[0 1 19 8 17 21 18 16 10 3 15 6 5 11 9], d=[1 3 8 11 15 9 22] and e=[0 7 269 291 194 337 120], which has already been mentioned above. The results of simulations have revealed the existence, in the corresponding turbocode, of sequences whose Hamming weight is equal to 34. This last value also seems to be equal to the minimum weight of the non-zero sequences of this code. Such a sequence will now be looked at a little more closely.

It corresponds for example to the coding of a sequence $$a(x) = \sum_{i \in I} x^i$$

where the set l is given by l={1067, 1076, 1077, 2329, 2330, 2334}.

Let $i| \to \Pi(i)$ be the effect of the interleaver on the position i of a symbol. The set $J=\{\Pi(i) : i \in I\}$ is then given by J={1760, 292, 1077, 285, 1070, 1767}. In the set J, the symbols $\Pi(i)$ appear in the order of increasing values of i.

In other words, the interleaver moves the position 1067 into the position 1760, the position 1076 into the position 292, the position 2329 into the position 285, the position 2330 into the position 1070 and the position 2334 into the position 1767. The position 1077 is not modified by the interleaver.

It can be seen that the sequence a(x) can be seen as the succession of two sub-sequences $a_1(x)=x^{1067}+x^{1076}+x^{1077}$ and $a_2(x)=x^{2329}+x^{2330}+x^{2334}$ which are both divisible by g(x). Likewise, the sequence a*(x) can be seen as the succession of the three sub-sequences $a_1{}^*(x)=x^{285}+x^{292}$, $a_2{}^*(x)=x^{1070}+x^{1077}$ and $a_3{}^*(x)=x^{1760}+x^{1767}$.

Then $b_1=a_1 f_1/g$, $b_2=a_2 f_1/g$, $c_1=a_1{}^* f_2/g$, $c_2=a_2{}^* f_2/g$, $c_3=a_3{}^* f_2/g$ can be defined. It is verified that the weights W(.) of these sequences are $W(b_1)=7$, $W(b_2)=3$, $W(c_1)=W(c_2)=W(c_3)=6$. With W(a)=6, this does indeed produce a weight equal to 6+7+3+6+6+6=34.

For other interleavers of size 2415 corresponding to the same values of R and M and to the same h as above, but with other choices of d and e, it is the reverse situation to that which has just been described which can occur. A sequence $$a(x) = \sum_{i \in I} x^i$$

of weight 6, where the set I is of the form I={r, r+7, s, s+7, t, t+7} can become after interleaving a sequence of the type $a^*(x)=a_1{}^*(x)+a_2{}^*(x)$, where the two polynomials $a_1{}^*(x)$ and $a_2{}^*(x)$ are divisible by g(x) and are both trinomes of small degree multiplied by a power of x.

Consequently, the weights of $a_1{}^* f_2/g$ and $a_2{}^* f_2/g$ would themselves be fairly small, and it may happen that the total weight of the corresponding coded sequence may once again be equal to 34.

If it is wished to obtain a turbocode with a minimum distance equal to or greater than 36, it will then be necessary to select a pair (d,e) for which the two situations which have just been mentioned do not occur.

Consider first of all the first of these situations. To prevent it, it is necessary to choose a pair (d,e) such that all the a(x)s of the form $a(x)=a_1(x)+a_2(x)$ producing an a*(x) of the form $a^*(x)=(1+x^7)(x^i+x^j+x^k)$ have the following property:

Property 7.1: Let p be the smallest power of x appearing in $a_1(x)$, and put $a_1(x)=x^p \alpha_1(x)$. Let q be the smallest power of x appearing in $a_2(x)$, and put $a_2(x)=x^q \alpha_2(x)$. The sum of the degrees of $\alpha_1$ and $\alpha_2$ is sufficiently high for the sum of the weights of $b_1=a_1 f_1/g$ and $b_2=a_2 f_1/g$ to be at least equal to 12.

Consider now the second of the situations mentioned above. To avoid it, it is therefore necessary to choose a pair (d,e) such that the a(x)s of the form $a(x)=(1+x^7)(x^i+x^j+x^k)$ producing an a*(x) of the form $a^*(x)=a^*{}_1(x)+a^*{}_2(x)$ where $a^*{}_1(x)$ and $a^*{}_2(x)$ are trinomes divisible by g(x), have the following property:

Property 7.2: Let p* be the smallest power of x appearing in $a^*{}_1(x)$, and put $a^*{}_2(x)=x^{p^*} \alpha^*{}_1(x)$. Let q* be the smallest power of x appearing in $a^*{}_2(x)$, and put $a^*{}_2(x)=x^{q^*} \alpha^*{}_2(x)$. The sum of the degrees of $\alpha^*{}_1$ and $\alpha^*{}_2$ is sufficiently high for the sum of the weights of $c_1=a^*{}_1 f_2/g$ and $c_2=a^*{}_2 f_2/g$ are at least equal to 12.

In parallel to the approach which has just been described, and which results in taking account of properties 7.1 and 7.2, it is necessary to note that the requirements placed on the values mini(i) introduced in section 5 and used in section 6 may be excessive compared with the aim pursued, which is to obtain a minimum distance equal to or greater than 36.

A search was therefore made for the pairs (d,e) which satisfy the properties 7.1 and 7.2, but under less onerous constraints with regard to the 6 mini(i) parameters introduced in section 5. In fact mini(1)=5 and mini(i)=4 for $i \geq 2$ were in fact chosen. Here are two pairs (d,e) found by this method:

1) d=[1 2 3 21 19 6 17], e=[0 6 224 246 209 112 142]. For this choice of d and e, the turbocode is such that the weight of the error sequences after decoding found during a simulation has never been less than 36 for a signal to noise ratio ranging up to 0.9 dB. An improvement in the performance is found (shown in FIGS. 16 and 17) compared with the case described in the previous section.

2) d=[1 6 10 15 8 7 22], e=[0 6 323 194 269 157 120]. For this choice of d and e, the turbocode is such that the weight of the error sequence after decoding found during a simulation has never been less than 38 for a signal to noise ratio ranging up to 0.8 dB.

Thus the methods of selecting the parameters (d,e) which have just been described make it possible to increase the level of the signal/noise ratio where the probability of error does not improve any further as a function of this ratio.

We now return to the general case ($\lambda$ arbitrary except for the fact that $r/\lambda$ is not prime).

9. Description of a Coder and Decoder Using an Interleaver in Accordance With the Invention It should be noted that the determination of a good interleaver as described previously can be effected either instantly in the coders and decoders themselves or preferably in advance. In the latter case, it is possible to store the interleavers entirely in ROM memory or more economically only the parameters necessary for generating the interleaver or interleavers. Then the previously explained construction algorithms are applied in order to generate the interleaver or interleavers, which can then be stored in RAM memory.

The description of a particular embodiment of the device implementing the present invention will now be continued with regard to FIGS. 18 to 22.

FIG. 18 illustrates schematically the constitution of a network station or computer coding station, in the form of a block diagram. This station has a keyboard 911, a screen 909, an external information source 910, and a radio transmitter 906, conjointly connected to an input/output port 903 of a processing card 901.

The processing card 901 has, connected together by an address and data bus 902:
- a central processing unit 900;
- a random access memory RAM 904;
- a non-volatile memory 905; and
- the input/output port 903.

Each of the elements illustrated in FIG. 18 is well known to persons skilled in the art of microcomputers and transmission systems and, more generally, information processing systems. These common elements are therefore not described here. It should however be noted that:
- the information source 910 is, for example, an interface peripheral, a sensor, a demodulator, an external memory or other information processing system (not shown), and is preferentially adapted to supply sequences of signals representing speech, service messages or multimedia data, notably of the IP or ATM type, in the form of sequences of binary data,
- the radio transmitter 906 is adapted to use a packet transmission protocol on a non-cabled channel, and to transmit these packets over such a channel.

It should also be noted that the word "register" used in the description designates, in each of the memories 904 and 905, both a memory area of low capacity (a few binary data) and a memory area of large capacity (making it possible to store an entire program).

The random access memory 904 stores data, variables and intermediate processing results, in memory registers bearing, in the description, the same names as the data whose values they store. The random access memory 904 contains notably the following registers:
- a register "N°_data" in which the length of the data sequence to be coded is stored,
- a register "a", in which there is stored a, the sequence of data to be coded, including the input sequence u and the padding bits guaranteeing divisibility of the sequence a by g (the input sequence u not necessarily being divisible by g, the first coder adds to the input sequence u a number of bits equal to the degree of g thus forming the sequence a in order to make the latter divisible by g)
- a register "a*" in which the interleaved sequence a* is stored,
- a register "a,b,c" in which there are stored the sequences resulting from the turbocoding a, b and c, and
- a register "radio_frame" in which the entire radio frame to be transmitted is stored.

The non-volatile memory 905 is adapted to store, in registers which, for convenience, have the same names as the data which they store:
- the operating program of the central processing unit 900, in a register "program",
- the sequence g, in a register "g",
- the sequence $f_1$, in a register "$f_1$",
- the sequence $f_2$, in a register "$f_2$",
- the size of the interleaver n, in a register "n",
- the table defining the interleaver, as a function of the value of n, in a register "interleaver", and
- the value, m, of the period of g, in a register "m".

The central processing unit 900 is adapted to implement the flow diagram described in FIG. 21.

In FIG. 19, it can be seen that a decoding device consists essentially of:
- three soft inputs 1001, 1002 and 1003 of sequences a, b and c, estimations of the coded sequences,
- a first decoder 1004 corresponding to the first elementary coder 102 (FIG. 1) and receiving the sequences a and b as well as an a priori information sequence w4, relating to the sequence a and initialised to zero, supplies an extrinsic estimation sequence w1 of the sequence a,
- an interleaver 1005, identical to the interleaver used in the coder, which on the one hand receives the sequence a and interleaves it as a sequence a* and on the other hand receives the sequence w1 and interleaves it in order to produce a new sequence w2 of a priori information now relating to the sequence a*,
- a second decoder 1006, corresponding to the second elementary coder 103 and receiving the sequences w2, a* and c, and supplies on the one hand an extrinsic estimation sequence w3 of the sequence a* and on the other hand an estimated sequence a*' of the sequence a*,
- a deinterleaver 1008 which is the inverse of the interleaver 1005 receiving the sequence a*' and supplying the estimated sequence a' of a, and
- a deinterleaver 1007, the inverse of the interleaver 1005, receiving the sequence w3 and supplying the sequence w4.

The estimated sequence a' is taken into account only following a redetermined number of iterations (see the article "Near Shannon limit error-correcting coding and decoding: turbocodes" cited above).

In accordance with the present invention, in initialising the decoders 1004 and 1006, account is taken of the fact that the elementary coders 102 and 103 each have a null initial state and a null final state.

FIG. 20 illustrates schematically the constitution of a network station or computer decoding station, in the form of a block diagram. This station has a keyboard 1111, a screen 1109, an external information destination 1110, and a radio receiver 1106, conjointly connected to an input/output port 1103 of a processing card 1101.

The processing card 1101 has, connected together by an address and data bus 1102:
- a central processing unit 1100;
- a random access memory RAM 1104;
- a non-volatile memory 1105; and
- the input/output port 1103.

Each of the elements illustrated in FIG. 20 is well known to persons skilled in the art of microcomputers and transmission systems and, more generally, information processing systems. These common elements are therefore not described here. It should however be noted that:
- the information destination 1110 is, for example, an interface peripheral, a display, a modulator, an external memory or other information processing system (not shown), and is preferentially adapted to receive sequences of signals representing speech, service messages or multimedia data notably of the IP or ATM type, in the form of sequences of binary data,
- the radio receiver 1106 is adapted to implement a packet transmission protocol on a non-cabled channel, and to transmit these packets over such a channel.

It should also be noted that the word "register" used in the description designates, in each of the memories 1104 and 1105, both a memory area of low capacity (a few binary data) and a memory area of large capacity (making it possible to store an entire program).

The random access memory 1104 stores data, variables and intermediate processing results, in memory registers bearing, in the description, the same names as the data whose values they store. The random access memory 1104 contains notably the following registers:

registers "received_data", in which there are respectively stored the received sequences (a, b, et c) and the interleaved sequence a*, registers "extrinsic_inf", in which there are respectively stored the intermediate decoding sequences (see FIG. 19), a register "estimated_data", in which there are stored the decoded sequences a*' and a',—a register "N°_iterations", in which the value of the number of iterations effected by the turbodecoder is stored, a register "N°_data", in which the length of the sequence to be decoded is stored, and a register "radio_frame", in which the entire radio frame received is stored.

The non-volatile memory 1105 is adapted to store, in registers which, for convenience, have the same names as the data which they store:

the operating program of the central processing unit 1100, in a register "program", the sequence g, in a register "g", the sequence $f_1$, in a register "$f_1$", the sequence $f_2$, in a register "$f_2$", the size of the interleaver, n, in a register "n", the table defining the interleaver and its inverse interleaver, as a function of n, in a register "interleavers", the value, m, of the period of g, in a register "m", and the maximum number of iterations in a register "max_N°_iteration".

The central processing unit 1100 is adapted to implement the flow diagram described in FIG. 22.

In FIG. 21, it can be seen that, following an initialisation operation 1201 of a type known to persons skilled in the art of systems including a central unit, during an operation 1202, the central unit 900 waits until a sequence of symbols to be coded is transmitted to it by the information source 910. It will be seen here that the end of this sequence is marked either by a fairly long delay before another symbol is transmitted, or by information having particular values signifying that the sequence is ended.

Next, during an operation 1203, the central unit 900 determines the number n' of symbols in the sequence which are to be transmitted, extracting the symbols which are not intended to be transmitted, in accordance with known procedures.

Then, during an operation 1204, the central unit performs a padding operation during which, at the end of the sequence of symbols to be transmitted, a number of binary symbols equal to the degree of the divisor polynomial g(x) is added so that the polynomial representation of the sequence is divisible by the polynomial g(x).

Then, in parallel:

a so-called stuffing operation 1205 is performed, during which binary symbols of zero value are added at the end of the sequence resulting from the padding operation, so that the number n of binary symbols of the final sequence is an acceptable multiple of number m, which is, it will be recalled, the smallest value such that the polynomial $x^m+1$ is divisible by the polynomial g(x);

an interleaver-choosing operation 1206 is performed as a function of its length n.

Next, the sequence resulting from the stuffing operation 1205 is turbocoded during a turbocoding operation 1207 using the interleaver chosen during the operation 1206, the divisor polynomial g(x) and the multiplier polynomials $f_1(x)$ and $f_2(x)$.

Then, during an operation of removing stuffing bits 1208:

the stuffing bits are removed at the end of the systematic sequence and of the first parity sequence in order to form respectively the sequences a and b.

Finally, during an operation 1209, the sequences a, b and c are inserted in radio frames, they modulate electromagnetic signals and are transmitted over a radio channel.

The operation 1202 is then reiterated.

In FIG. 22, it can be seen that, following an initialisation operation 1301 of a type known to persons skilled in the art of systems including a central unit, during an operation 1302, the central unit 1100 waits until a radio frame is transmitted to it by the coding and transmission device. It will be noted here that the end of this radio frame is marked, by information having particular values.

Next, during an operation 1303, the central unit 1100 determines the number n and the number of stuffing bits of symbols of the radio frame which are to be decoded.

Then, in parallel:

during an operation 1304, the central unit 1100 performs a stuffing operation on the first two sequences to be decoded, by adding to them stuffing bits and the corresponding parity bits with a reliability value which is the highest possible corresponding to a zero hard bit so that the length of the resulting sequence is equal to n, and during an operation 1305, the central unit 1100 effects the choice of the interleaver and its inverse interleaver, taking into account the value of n, in the non-volatile memory 1105.

Next, during an operation 1306, the three sequences resulting, for the first two from the stuffing operation 1304 and for the last one from the operation 1303, are decoded in accordance with turbodecoding procedures well known to persons skilled in the art. Here, these procedures use the interleavers chosen during the operation 1305, the divisor polynomial g(x), the multiplier polynomials $f_1(x)$ and $f_2(x)$, a number of iterations less than or equal to the maximum number of iterations authorised and an initialisation of the elementary decoders taking into account the fact that the initial and final states of the coders are zero. This operation supplies an estimation a' of the sequence a.

Then, during an operation 1307, the symbols added during the stuffing operation 1304 and those resulting from a padding operation performed on coding (see operation 1204), and which are, for the latter, equal in number to the degree of the divisor polynomial g(x), are removed from the sequence a' in order to form the transmitted sequence. Finally, the sequence is transmitted to the information destination 1310 and the operation 1302 is reiterated.

According to a variant, the random access memory 904 (or respectively 1104) is removable, partially or totally, and has, for example, a magnetic tape, a diskette or a rewritable compact disc.

It should be noted in general that in the interleaving method as described the data are read row by row (in the matrix A) before and after interleaving.

It is also clear that, during the practical implementation of the interleaving (or deinterleaving) method, a step of putting the incoming data in matrix form is not necessarily passed through. It is possible, using the permutation table of the interleaver (which associates an output position with each input position, after permutation), to work directly on the incoming data as they arrive. The method however remains unchanged in its principle.

Naturally, the present invention is not limited to the details of the embodiments described here by way of example, but on the contrary extends to any modifications within the capability of a person skilled in the art.

In particular, it extends to the case where the alphabet on which the turbocode is defined contains q letters, with q a power of a prime number. The alphabet can then receive the structure of the Galois field with q elements.

Likewise, the invention has been described here using two interleavers. Clearly it applies more generally to the case of a code having several interleavers with feedback polynomials in accordance with the description.

The invention also applies to any type of turbocode, including notably serial or hybrid turbocodes.

The invention also applies to a telephone, a photographic apparatus, a printer, a scanner, a camera, a computer, a facsimile machine, a television receiver or an audio/video player, having a device as briefly disclosed above.

In the same way, the invention also applies to an information storage means and an information storage means which is removable, partially or totally, which can be read by a computer or a microprocessor storing instructions of a computer program, making it possible to implement the method succinctly disclosed above.

APPENDIX

We present, to begin with, the MATLAB program intended to avoid the second unfavourable situation mentioned above in the framework of the general $\lambda > 1$ case.

This program tests a matrix, a, such as the one given in FIG. 8. The program uses a matrix known as filt and a vector referred to as zero:

```
filt =[
-1 1 0 0 0 0 0 0
 0 -1 1 0 0 0 0 0
 0 0 0 -1 1 0 0 0 0
 0 0 0 0 -1 1 0 0 0
 0 0 0 0 0 0 -1 1 0
 0 0 0 0 0 0 0 -1 1
];
zero = [
0 0 0 0 0 0
]';
```

It first of all constructs a matrix m by juxtaposing a with itself:

```
m=[
    a a
];
``` and initialises a parameter y to zero:

y = 0 ;

It next constructs the steps of 9 pairs of indices (i, ii), (i, ii+2), (i, ii+3) (j, jj), (j, jj+2), (j, jj+3) (k, kk), (k, kk+2), (k, kk+3)

and constructs the 9-tuple d whose elements are the elements of the matrix m in each of the above 9 positions, from (i, ii) to (k, kk+3):

```
i=0 ;
while ((y==0)+(i<6))==2,i=i+1;ii=0;
while ((y==0)+(ii<7))==2,ii=ii+1;aa=[m(i,ii) m(i,ii+2) m(i,ii+3)];
j=i;
while ((y==0)+(j<7))==2,j=j+1;jj=0;
while ((y==0)+(jj<7))==2,jj=jj+1;bb=[m(j,jj) m(j,jj+2) m(j,jj+3)];
k=j;
while ((y==0)+(k<8))==2,k=k+1;kk=0;
while ((y==0)+(kk<7))==2,kk=kk+1;cc=[m(k,kk) m(k,kk+2) m(k,kk+3)];
d=[aa bb cc];
```

It reorders the 9 elements of d in increasing order:

```
for iii=1:8,for jjj=1+iii:9,if d(iii)>d(jjj),
side=d(iii);d(iii)=d(jjj);d(jjj)=side;
end;end;end;
``` and checks that the number of pairs of equal consecutive elements in d is not equal to 6.

If it is, it puts y = y+1:

```
qq=filt*d';q=[1 1 1 1 1 1 ]*(qq==zero);
if q==6,y=y+1;end;
end;end;end;end;end;end;
```

If, at the end of the calculation, y is still zero, the test is positive and the program puts m = a:

if y==0, m=a, end;

The program GOODH.M
q44=[
1 -2 1 0 0
0 1 -2 1 0

APPENDIX-continued

```
0 0 1 -2 1
];
q46=[
1 -1 -1 1 0
0 1 -1 -1 1
1 1 -2 0 0
0 1 1 -2 0
0 0 1 1 -2
1 0 -2 1 0
0 1 0 -2 1
2 -1 -1 0 0
0 2 -1 -1 0
0 0 2 -1 -1
1 -2 0 1 0
0 1 -2 0 1
1 -1 1 -1 0
0 1 -1 1 -1
];
q48=[
1 -1 0 1 -1
1 -1 0 -1 1
1 0 -1 -1 1
1 -1 -1 0 1
1 0 -1 1 -1
1 -1 1 0 -1
1 0 -2 0 1
1 0 0 -2 1
1 -2 0 0 1
1 0 1 -2 0
0 1 0 1 -2
2 -1 0 -1 0
0 2 -1 0 -1
1 1 -1 -1 0
0 1 1 -1 -1
];
q6=[
2 -3 1 0 0
0 2 -3 1 0
0 0 2 -3 1
1 -3 2 0 0
0 1 -3 2 0
0 0 1 -3 2
1 -2 2 -1 0
0 1 -2 2 -1
];
q=[q44' q46' q48' q6'];dq=size(q);
u=n*n;for i=1:dq(1),u(i)=n*n;end;u=u';k=0;res=0;res(15)=0;nc=0;
n0=0;n1=0;n2=0;n3=0;n4=0;n5=0;n6=0;n7=0;n8=0;n9=0;n10=0;
n11=0;n12=0;n13=0;n14=0;n15=0;n16=0;n17=0;n18=0;n19=0;
n20=0;n21=0;n22=0;nm1=0;nm2=0;nm3=0;nm4=0;nm5=0;
a0=0;s0=0;s0(n-1)=0;
for x1=1,if s0(x1)==0,
s1=s0;s1(x1)=1;
a1=[a0 x1];n1=1+n1;avance=[x1 n1]
for x2=1:n-1,if s1(x2)==0,
s2=s1;s2(x2)=1;
a2=[a1 x2];n2=1+n2;avance=[x1 x2 n1 n2]
for x3=1:n-1,if s2(x3)==0,
s3=s2;s3(x3)=1;
a3=[a2 x3];n3=1+n3;%avance=[x1 x2 x3 n1 n2 n3]
for x4=1:n-1,if s3(x4)==0,
s4=s3;s4(x4)=1;
a4=[a3 x4];n4=1+n4;%avance=[n1 n2 n3 n4]
f=a4';g=rem(q*f+u,n);if min(g)>0,
for x5=1:n-1,if s4(x5)==0,
s5=s4;s5(x5)=1;
a5=[a4 x5];n5=1+n5;
f=a5(2:6)';g=rem(q*f+u,n);if min(g)>0,
for x6=1:n-1,if s5(x6)==0,
s6=s5;s6(x6)=1;
a6=[a5 x6];n6=1+n6;
f=a6(3:7)';g=rem(q*f+u,n);if min(g)>0,
for x7=1:n-1,if s6(x7)==0,
s7=s6;s7(x7)=1;
a7=[a6 x7];n7=1+n7;
f=a7(4:8)';g=rem(q*f+u,n);if min(g)>0,
for x8=1:n-1,if s7(x8)==0,
s8=s7;s8(x8)=1;
a8=[a7 x8];n8=1+n8;
```

APPENDIX-continued

```
f=a8(5:9)';g=rem(q*f+u,n);if min(g)>0,
for x9=1:n-1,if s8(x9)==0,
s9=[s8;s9(x9)=1;
a9=[a8 x9];n9=1+n9;
f=a9(6:10)';g=rem(q*f+u,n);if min(g)>0,
for x10=1:n-1,if s9(x10)==0,
s10=s9;s10(x10)=1;
a10=[a9 x10];n10=1+n10;
f=a10(7:11)';g=rem(q*f+u,n);if min(g)>0,
for x11=1:n-1,if s10(x11)==0,
s11=s10;s11(x11)=1;
a11=[a10 x11];n11=1+n11;
f=a11(8:12)';g=rem(q*f+u,n);if min(g)>0,
for x12=1:n-1,if s11(x12)==0,
s12=s11;s12(x12)=1;
a12=[a11 x12];n12=1+n12;
f=a12(9:13)';g=rem(q*f+u,n);if min(g)>0,
for x13=1:n-1,if s12(x13)==0,
s13=s12;s13(x13)=1;
a13=[a12 x13];n13=1+n13;
f=a13(10:14)';g=rem(q*f+u,n);if min(g)>0,
for x14=1:n-1,if s13(x14)==0,
s14=s13;s14(x14)=1;
a14=[a13 x14];n14=1+n14;
f=a14(m-4:m)';g=rem(q*f+u,n);if min(g)>0,
anm1=[a14 0];nm1=1+nm1;
f=anm1(m-3:m+1)';g=rem(q*f+u,n);if min(g)>0,
anm2=[anm1 x1];nm2=1+nm2;
f=anm2(m-2:m+2)';g=rem(q*f+u,n);if min(g)>0,
anm3=[anm2 x2];nm3=1+nm3;
f=anm3(m-1:m+3)';g=rem(q*f+u,n);if min(g)>0,
anm4=[anm3 x3];nm4=1+nm4;
f=anm4(m:m+4)';g=rem(q*f+u,n);if min(g)>0,
nm5=1+nm5;nc=1+nc;
res(nc,:)=a14;
end;end;end;end;end;end;end;end;end;end;
end;end;end;end;end;end;end;end;end;end;
end;end;end;end;end;end;end;end;end;end;
end;end;end;end;end;end;end;
```

```
The program DISTM.M
r=17;m=8;rm=r*m;step=10;
for d=1:r-1,a=ggg(d,:);a=[a a];res=0;res(rm)=0;z=0;
    for dp=1:r-1,
    b=ggg(dp,:);b=[b b];lis=0;lis(rm)=0;
        for i=1:rm,maxi=rm;b=[b(2*rm) b(1:2*rm-1)];
            for j=1+step:rm+step,
                for k=j-step:j+step,
                    val=abs(j-k)+abs(a(j)-b(k));
                    maxi=min(maxi,val);
                end;
            end;
            lis(i)=maxi;
        end;
        z=z+1;res(z,:)=lis,
    end;
diary sink.m;f1=res',diary off
end;
```

```
The program SELEC.M
r=17;m=8;
mini1=5;mini2=3;mini3=3;mini4=3;mini5=3;mini6=5;
rm=r*m;h=r-1;
for i=1:6,for j=i:6,norme(i,j)=1;end;end;
k=0;resd=0;resd(7)=0;rese=0;rese(7)=0;
u=1;for i=1:rm,u(i)=1;end;
u2=u(1:2);u3=u(1:3);u4=u(1:4);u5=u(1:5);
th1=mini1*u;th2=mini2*u;th3=mini3*u;
th4=mini4*u;th5=mini5*u;th6=mini6*u;
d1=1;for d2=2:h,d=[d1 d2];d12=f(h*(d1-1)+d2,:)>th1;
for i12=1:rm,if d12(i12)>0,lis12=i12;
for d3=2:h,if (d2==d3)<1,d=[d(1:2) d3];
d23=f(h*(d2-1)+d3,:)>th1;d13=f(h*(d1-1)+d3,:)>th2;
for i23=1:rm,if d23(i23)>0,i13=rem(i12+i23,rm);
if i13>0,if d13(i13)>0,lis13=[lis12 i23];
for d4=2:h,if sum((d4*u2)==d(2:3))<1,d=[d(1:3) d4];
d34=f(h*(d3-1)+d4,:)>th1;d24=f(h*(d2-1)+d4,:)>th2;
d14=f(h*(d1-1)+d4,:)>th3;
for i34=1:rm,if d34(i34)>0,i24=rem(i23+i34,rm);
```

APPENDIX-continued

```
if i24>0,if d24(i24)>0,i14=rem(i12+i24,rm);
if i14>0,if d14(i14)>0,lis14=[lis13 i34];
for d5=2:h,if sum((d5*u3)==d(2:4))<1,d=[d(1:4) d5];
d45=f(h*(d4-1)+d5,:)>th1;d35=f(h*(d3-1)+d5,:)>th2;
d25=f(h*(d2-1)+d5,:)>th3;d15=f(h*(d1-1)+d5,:)>th4;
for i45=1:rm,if d45(i45)>0,i35=rem(i34+i45,rm);
if i35>0,if d35(i35)>0,i25=rem(i24+i45,rm);
if i25>0,if d25(i25)>0,i15=rem(i14+i45,rm);
if i15>0,if d15(i15)>0,lis15=[lis14 i45];
for d6=2:h,if sum((d6*u4)==d(2:5))<1,d=[d(1:5) d6];
d56=f(h*(d5-1)+d6,:)>th1;d46=f(h*(d4-1)+d6,:)>th2;
d36=f(h*(d3-1)+d6,:)>th3;d26=f(h*(d2-1)+d6,:)>th4;
d16=f(h*(d1-1)+d6,:)>th5;
for i56=1:rm,if d56(i56)>0,i46=rem(i45+i56,rm);
if i46>0,if d46(i46)>0,i36=rem(i35+i56,rm);
if i36>0,if d36(i36)>0,i26=rem(i25+i56,rm);
if i26>0,if d26(i26)>0,i16=rem(i15+i56,rm);
if i16>0,if d16(i16)>0,lis16=[lis15 i56];
for d7=2:h,if sum((d7*u5)==d(2:6))<1,d=[d(1:6) d7];
d67=f(h*(d6-1)+d7,:)>th1;d57=f(h*(d5-1)+d7,:)>th2;
d47=f(h*(d4-1)+d7,:)>th3;d37=f(h*(d3-1)+d7,:)>th4;
d27=f(h*(d2-1)+d7,:)>th5;d17=f(h*(d1-1)+d7,:)>th6;
for i67=1:rm,if d67(i67)>0,i57=rem(i56+i67,rm);
if i57>0,if d57(i57)>0,i47=rem(i46+i67,rm);
if i47>0,if d47(i47)>0,i37=rem(i36+i67,rm);
if i37>0,if d37(i37)>0,i27=rem(i26+i67,rm);
if i27>0,if d27(i27)>0,i17=rem(i16+i67,rm);
if i17>0,if d17(i17)>0,lis17=[lis16 i67];
k=k+1,resd(k,:)=d;bil=rem(lis17*norme,rm);rese(k,:)=[0 bil];
end;end;end;
end;end;end;end;end;end;
end;end;end;end;end;end;end;
end;end;end;end;end;end;end;end;end;
end;end;end;end;end;end;end;end;end;end;end;
end;end;end;end;end;end;end;end;end;end;end;end;end;
```

What is claimed is:

1. Permutation method, characterised in that it makes an output rank from 0 to r·m−1 correspond to each input rank from 0 to r·m−1, the said method including the following steps:

E1—a matrix S having r rows and m columns is considered, filled row by row by the successive numbers from 0 to r·m−1, E2—each column in said matrix S is divided into a predetermined number $\lambda$ of sub-columns, such that r/$\lambda$ is not prime, E3—the sub-columns of S equal in number to $\lambda$·m are designated by $S_{\lambda_1}^{\lambda_2}$ with $0 \leq \lambda_1 \leq \lambda-1$ and $0 \leq \lambda_2 \leq m-1$ where $\lambda_2$ refers to the column of S where $S_{\lambda_1}^{\lambda_2}$ appears and $\lambda_1$ refers to the position of the sub-column $S_{\lambda_1}^{\lambda_2}$ in the column of index $\lambda_2$.

E4—each sub-column $S_{\lambda_1}^{\lambda_2}$ is then written in the form of a matrix with R rows and M columns (with r/$\lambda$=RM) and in this form it is interleaved by an interleaver of the so-called "wheel" type defined by a circular permutation of each column of said matrix with R rows and M columns, said interleaver not being identity, E5—this matrix with R rows and M columns is reconverted, after said circular permutations on its columns, into a sub-column $S^*_{\lambda_1}{}^{\lambda_2}$ which will occupy, in a matrix S*, the same position as that occupied by $S_{\lambda_1}^{\lambda_2}$ in the matrix S, E6—the permutation table consists of pairs each formed by an element of the matrix S and the element with the same position in the matrix S*.

2. Method according to claim 1, characterised in that it also includes, in at least one column $\lambda_2$ ($0 \leq \lambda_2 m-1$) of the matrix S*, a modification of the order of appearance of the sub-columns $S^*_{\lambda_1}{}^{\lambda_2}$.

3. Method according to either one of claims 1 to 2, characterised in that the same wheel interleaver is used for producing each of the $\lambda$ sub-columns $S^*_{\lambda_1}{}^{\lambda_2}$ of a given column $\lambda_2$ of the matrix S*.

4. Method according to claim 3, characterised in that the sub-columns of at least two columns in the matrix S* are produced by different wheel interleavers.

5. Method according to claim 4, characterised in that the m wheel interleavers used for producing the sub-columns in each column in the matrix S* are different.

6. Permutation method, characterised in that it makes an output rank from 0 to r.m−1 correspond to each input rank from 0 to r.m−1, the said method including the following steps:

E1—a matrix S including r rows and m columns is considered, filled row by row by the successive numbers from 0 to r·m−1, E2—the m columns of S are designated by $S_l$ with $0 \leq l \leq m-1$, E3—each column $S_l$ is then written in the form of a matrix with R rows and M columns, where R and M satisfy RM=r, and in this form it is interleaved by an interleaver of the so-called "wheel" type, defined by a circular permutation of each column in said matrix with R rows and M columns, said interleaver not being identity, E4—this matrix with R rows and M columns is reconverted, after said circular permutations on its columns, into a column $S^*_l$ which will occupy, in a matrix S*, the same position as that occupied by $S_l$ in the matrix S, E5—each column $S^*_l$ in the matrix S* is permuted by means of a circular permutation, E6—the permutation table consists of pairs each formed by an element of the matrix S and the element with the same position in the matrix S*.

7. Method according to claim 6, characterised in that at least two columns of the matrix S* are obtained using different wheel interleavers.

8. Method according to claim 7, characterised in that the m wheel interleavers used for producing the m columns of the matrix S* are all different.

9. Method according to any one of claims 6 to 8, characterised in that, during step E5, at least one column S*$_l$ in the matrix S* is permuted by means of a circular permutation different from identity.

10. Method according to any one of claims 1, 2, 6, 7, or 8, characterised in that it also includes a step of permutation of the columns of S* with each other.

11. Method of permuting symbols in a sequence of binary data, representing a physical quantity, represented by a polynomial $$a(x) = \sum_{j,k} a_{j,k} x^{jm+k},$$

with binary coefficients, divisible by a first divisor polynomial $$g(x) = 1 + \sum_{i=1}^{l-1} g_i x^i + x^l,$$

with binary coefficients, supplying a new sequence of binary symbols represented by a polynomial $$a^*(x) = \sum_{j,k} a_{j,k} x^{s^*_{j,k}},$$

divisible by a second divisor polynomial $$g^*(x) = 1 + \sum_{i=1}^{l-1} g_i^* x^i + x^l,$$

characterised in that s*$_{j,k}$ is the element in position (j,k) in the matrix S* obtained according to a method according to any one of claims 1, 2, 6, 7 or 8 and m is a multiple of the smallest integer m' such that the first divisor polynomial g(x) divides $x^{m'}+1$.

12. Method of permuting the symbols in a sequence of binary data, representing a physical quantity, represented by a polynomial $$a(x) = \sum_{j,k} a_{j,k} x^{jm+k},$$

with binary coefficients, divisible by a first divisor polynomial $$g(x) = 1 + \sum_{i=1}^{l-1} g_i x^i + x^l,$$

with binary coefficients, supplying a new sequence of binary symbols represented by a polynomial $$a^*(x) = \sum_{j,k} a_{s^*_{j,k}} x^{jm+k},$$

divisible by a second divisor polynomial $$g^*(x) = 1 + \sum_{i=1}^{l-1} g_i^* x^i + x^l,$$

characterised in that S*$_{j,k}$ is the element in position (j,k) in the matrix S* obtained according to a method according to any one of claims 1, 2, 6, 7 or 8 and m is a multiple of the smallest integer m' such that the first divisor polynomial g(x) divides $x^{m'}+1$.

13. Method according to claim 11, characterised in that the second divisor polynomial g*(x) is equal to the first divisor polynomial g(x).

14. Coding method characterised in that it includes an operation of determining a sequence a*, during which at least one permutation method according to claim 11 is implemented.

15. Coding method according to claim 14, working on sequences of binary data u representing information and taking into account a first divisor polynomial $$g(x) = 1 + \sum_{i=1}^{l-1} g_i x^i + x^l,$$

a second divisor polynomial g*(x) compatible with g(x), a first multiplier polynomial f$_1$(x) and a second multiplier polynomial f$_2$(x), an integer number r≧1, said method includes:

an operation of forming a "first" sequence, referred to as "sequence a", represented by a polynomial a(x) referred to as the "first polynomial", whose first r·m−t coefficients of increasing order are the binary data to be coded and whose last t coefficients are chosen in such a way that the polynomial g(x) divides the polynomial a(x)

an operation of forming a second sequence known as "sequence b" represented by a polynomial b(x) equal to the product of the first polynomial a(x) and the first multiplier polynomial f$_1$(x), the whole divided by the first divisor polynomial g(x), a permutation operation, working on binary data in the first sequence a in order to form a so-called "permuted" sequence a* represented by a so-called "permuted" polynomial a*(x), whose coefficients of increasing order are the binary data of the permuted sequence a*, and which is divisible by the second divisor polynomial g*(x), an operation of forming a third sequence known as "sequence c" represented by a polynomial c(x) equal to the product of the permuted polynomial a*(x) and the second multiplier polynomial f$_2$(x), the whole divided by the second divisor polynomial g*(x).

16. Decoding method, characterised in that it implements at least one permutation method according to any one of claim 11.

17. Turbodecoding method, characterised in that it implements at least one permutation method according to any one of claim 11.

18. Method adapted to decode sequences received after coding by the coding method according to claim 14.

19. Method according to any one of claims 1, 2, 6, 7 or 8 characterised in that the alphabet on which the turbocode is defined contains q letters, with q a power of a prime number, the alphabet receiving the structure of the Galois field with q elements.

20. Permutation device, characterised in that it comprises means of making an output rank from 0 to r·m−1 correspond to each input rank from 0 to r·m−1, said device comprising notably means of:

E1—considering a matrix S including r rows and m columns, filled row by row by the successive numbers from 0 to r·m−1, E2—designating the m columns of S by $S_l$ with $0 \leq l \leq m-1$, E3—writing each column $S_l$ in the form of a matrix with R rows and M columns, where R and M satisfy RM=r, and interleaving in this form by an interleaver of the so-called "wheel" type, defined by a circular permutation of each column in said matrix with R rows and M columns, said interleaver not being identity, E4—reconverting this matrix with R rows and M columns, after said circular permutations on its columns, into a column $S^*_l$ which will occupy, in a matrix $S^*$, the same position as that occupied by $S_l$ in the matrix S, E5—permuting each column $S^*_l$ in the matrix $S^*$ by means of a circular permutation, E6—forming a permutation table consisting of pairs each formed by an element of the matrix S and the element with the same position in the matrix $S^*$.

21. Device according to claim 20, characterised in that at least two columns in the matrix $S^*$ are obtained using different wheel interleavers.

22. Device according to claim 21, characterised in that the m wheel interleavers used for producing the m columns in the matrix $S^*$ are all different.

23. Device according to any one of claims 20 to 22, characterised in that it also has means of permuting columns of $S^*$ with each other.

24. Device according to any one of claims 20 to 23, characterised in that it has means of permuting at least one column $S^*_l$ of the matrix $S^*$ by means of a circular permutation different from identity.

25. Permutation device (101) adapted to supply, from a sequence a of binary data representing a physical quantity, associated with a polynomial $$a(x) = \sum_{j,k} a_{j,k} x^{jm+k},$$

divisible by a first divisor polynomial g(x), and whose coefficients of increasing order are the binary data of the sequence a, a permuted sequence a* associated with a polynomial a*(x) whose coefficients of increasing order are the binary data of the sequence a*, said polynomial a*(x) being intended to be divided by a second divisor polynomial g*(x) compatible with the first divisor polynomial g(x), in order to form a sequence of binary data c, and a having a number of binary data equal to the product of an integer number r by the integer m, m being a multiple of the smallest integer m' such that the first divisor polynomial g(x) divides $x^{m'}+1$, characterised in that the permuted sequence a* is given by $$\sum_{j,k} a_{j,k} x^{s^*_{j,k}},$$

where the matrix $S^*$ with elements $S^*_{j,k}$ is produced according to any one of claims 1, 2, 6, 7, or 8.

26. Permutation device (101) adapted to supply, from a sequence a of binary data representing a physical quantity, associated with a polynomial $$a(x) = \sum_{j,k} a_{j,k} x^{jm+k},$$

divisible by a first divisor polynomial g(x), and whose coefficients of increasing order are the binary data of the sequence a, a permuted sequence a* associated with a polynomial a*(x) whose coefficients of increasing order are the binary data of the sequence a*, said polynomial a*(x) being intended to be divided by a second divisor polynomial g*(x) compatible with the first divisor polynomial g(x), in order to form a sequence of binary data c, and a having a number of binary data equal to the product of an integer number r and the integer m, m being a multiple of the smallest integer m' such that the first divisor polynomial g(x) divides $x^{m'}+1$, characterised in that the permuted sequence a* is given by $$= \sum_{j,k} a_{s^*_{j,k}} x^{jm+k},$$

where the matrix $S^*$ with elements $S^*_{j,k}$ is produced according to any one of claims 1, 2, 6, 7, or 8.

27. Coding device characterised in that it includes a device according to any one of claims 20, 21, or 22.

28. Coding device according to claim 27, working on sequences of binary data u representing information and taking into account a first divisor polynomial $$g(x) = 1 + \sum_{i=1}^{l-1} g_i x^i + x^l,$$

a second divisor polynomial g*(x) compatible with g(x), a first multiplier polynomial $f_1(x)$ and a second multiplier polynomial $f_2(x)$, an integer number $r \geq 1$, an integer number m which is a multiple of the smallest integer m' such that the first polynomial g(x) divides $x^{m'}+1$, characterised in that it has:

means of forming a "first" sequence, referred to as "sequence a", represented by a polynomial a(x) referred to as the "first polynomial", whose first r·m−t coefficients of increasing order are the binary data to be coded and whose last t coefficients are chosen in such a way that the polynomial g(x) divides the polynomial a(x)

means of forming a second sequence known as "sequence b" represented by a polynomial b(x) equal to the product of the first polynomial a(x) and the first multiplier polynomial $f_1(x)$, the whole divided by the first divisor polynomial g(x), permutation means, working on binary data in the first sequence a in order to form a so-called "permuted" sequence a* represented by a so-called "permuted"

polynomial a*(x), whose coefficients of increasing order are the binary data of the permuted sequence a*, and which is divisible by the second divisor polynomial g*(x), means of forming a third sequence known as "sequence c" represented by a polynomial c(x) equal to the product of the permuted polynomial a*(x) and the second multiplier polynomial $f_2(x)$, the whole divided by the second divisor polynomial g*(x).

29. Decoding device, characterised in that it uses at least one of a device according to any one of claims 20, 21, or 22 and a deinterleaver corresponding to this interleaver.

30. Turbodecoding device characterised in that it uses at least one of a device according to any one of claims 20, 21, or 22 and a deinterleaver corresponding to this interleaver.

31. Device adapted to decode sequences received after coding by a coding device according to claim 27.

32. Device according to claim 25, characterised in that it has a transmission means adapted to transmit on the one hand the sequence a, and on the other hand a sub-set of the data of the sequences produced by the coder.

33. Device for processing signals representing speech, characterised in that it has a device according to any one of claims 20, 21 or 22.

34. Data transmission device having a transmitter adapted to implement a packet transmission protocol, characterised in that it has a device according to any one of claims 20, 21, or 22.

35. Data transmission device according to claim 34, characterised in that said protocol is the ATM (Asynchronous Transfer Mode) protocol.

36. Data transmission device according to claim 34, characterised in that said protocol is the Internet Protocol (IP).

37. Data transmission device having a transmitter transmitting over a non-cable channel, characterised in that it has a device according to any one of claims 20, 21 or 22.

38. Network station, characterised in that it has a device according to any one of claims 20, 21 or 22.

* * * * *

UNITED STATES PATENT AND TRADEMARK OFFICE
CERTIFICATE OF CORRECTION

PATENT NO. : 6,404,360 B1
DATED : June 11, 2002
INVENTOR(S) : Piret et al.

It is certified that error appears in the above-identified patent and that said Letters Patent is hereby corrected as shown below:

Column 6,
Line 19, "$x^{m'}+1$" should read -- $x^{m'}+1$, --.

Column 8,
Line 55, "ratio $E_b/N_o$)" should read -- ratio $(E_b/N_o)$ --.

Column 10,
Line 38, "$S^*_{j,k}$" should read -- $s^*_{j,k}$ --.

Column 16,
Line 34, "q=6," should read -- q=8, --; and
Line 45, "he" should read -- the --.

Column 17,
Line 59, "$E_n/N_o$" should read -- $E_b/N_o$ --; and
Line 66, "its" should read -- this --.

Column 18,
Line 23, "amplitude $H_j$" should read -- amplitude $h_j$ --;
Line 40, "$+Z_{34}\ x^{34}$" should read -- $+z_{34}x^{34}$ --;
Line 41, "$+Z_{34}\ x^{19}$," should read -- $+z_{34}x^{19}$, --; and
Line 59, "modulo $X^{RM}\text{-}1$." should read -- modulo $x^{RM}\text{-}1$. --.

Column 19,
Line 62, "Hamming weight $W_H(V)$" should read -- Hamming weight $W_H(v)$ --.

Column 20,
Line 16, "$W_H(a^{(k)(x))}=4$." should read -- $W_H(a^{(k)}(x))=4$. --; and
Line 62, "$a^{(k)}(X^m)$," should read -- $a^{(k)}(x^m)$, --.

Column 21,
Line 15, "[1 -1 -1 1 0" should read -- [1 -1 1 -1 0 --.

Column 22,
Line 54, "$^{th}$ column" should read -- $i^{th}$ column --.

Column 23,
Line 54, "of $e_1$," should read -- of e, --.

UNITED STATES PATENT AND TRADEMARK OFFICE
CERTIFICATE OF CORRECTION

PATENT NO.    : 6,404,360 B1
DATED         : June 11, 2002
INVENTOR(S)   : Piret et al.

It is certified that error appears in the above-identified patent and that said Letters Patent is hereby corrected as shown below:

Column 25,
Line 39, "$c_2=a_2$" (second occurrence) should be deleted; and
Line 40, "*f/g," (first occurrence) should be deleted.

Column 28,
Line 30, close up line space between "following a" and "redetermined" on next line; and
Line 31, "redetermined" should read -- predetermined --.

Column 37,
Line 65, "$(0 \leq \lambda_2 m\text{-}1)$" should read -- $(0 \leq \lambda_2 \leq m\text{-}1)$ --.

Column 39,
Line 47, "8" should read -- 8, --.

Column 40,
Line 13, "8" should read -- 8, --;
Line 61, "any one of" should be deleted;
Line 64, "any one" should be deleted; and
Line 65, "of" should be deleted.

Column 41,
Line 1, "8" should read -- 8, --; and
Line 43, "23," should read -- 22, --.

Column 42,
Line 34, "elements $S*_{j,k}$" should read -- elements $s*_{j,k}$ --.

Signed and Sealed this

Eighth Day of April, 2003

JAMES E. ROGAN
*Director of the United States Patent and Trademark Office*